United States Patent
Chen et al.

(10) Patent No.: US 11,336,410 B2
(45) Date of Patent: May 17, 2022

(54) ZONE-BASED SIGNALING IN NEW RADIO

(71) Applicant: QUALCOMM Incorporated, San Diego, CA (US)

(72) Inventors: Wanshi Chen, San Diego, CA (US); Prashanth Haridas Hande, San Diego, CA (US); Jay Kumar Sundararajan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 6 days.

(21) Appl. No.: 16/931,267

(22) Filed: Jul. 16, 2020

(65) Prior Publication Data

US 2021/0036821 A1     Feb. 4, 2021

Related U.S. Application Data

(60) Provisional application No. 62/881,671, filed on Aug. 1, 2019.

(51) Int. Cl.
    *H04L 5/00*         (2006.01)
    *H04L 25/02*       (2006.01)
    (Continued)

(52) U.S. Cl.
    CPC .......... *H04L 5/0048* (2013.01); *H03M 13/09* (2013.01); *H04L 5/0023* (2013.01);
    (Continued)

(58) Field of Classification Search
    CPC ... H04L 5/0023; H04L 5/0048; H04L 5/0094; H04L 25/0204; H04L 25/0212;
    (Continued)

(56) References Cited

U.S. PATENT DOCUMENTS

2020/0178039 A1*    6/2020   Lee ........................ H04W 4/46
2020/0336872 A1*   10/2020   Basu Mallick ....... H04W 4/029
(Continued)

OTHER PUBLICATIONS

HUAWEI., et al., "Sidelink Physical Layer Procedures for NR V2X," 3GPP Draft, 3GPP TSG RAN WG1 Meeting #97, R1-1906008, 3rd Generation Partnership Project (3GPP), Mobile Competence Centre, 650, Route Des Lucioles, F-06921, Sophia-Antipolis Cedex, France, vol. RAN WG1. No. Reno, USA; May 13, 2019-May 17, 2019, May 3, 2019 (May 3, 2019), XP051708050, 23 pages, Retrieved from the Internet: URL: http://www.3gpp.org/ftp/tsg%5Fran/WG1%5FRL1/TSGR1%5F97/Docs/R1%2D1906008%2Ezip, [retrieved on May 3, 2019], pp. 6-8, 2.4.1.1 HARQ feedback, decision, making.
(Continued)

*Primary Examiner* — David B Lugo
(74) *Attorney, Agent, or Firm* — Holland & Hart LLP

(57) ABSTRACT

Methods, systems, and devices for wireless communications are described. According to one or more aspects, a device, such as a user equipment (UE), may receive a signal including one or more channel transmission parts associated with one or more zones. The UE may identify, based on receiving the signal, at least one zone of the one or more zones that is associated with the UE. Additionally or alternatively, the UE may identify multiple zones of the one or more zones that are associated with the UE. The UE may select a channel transmission part of the one or more channel transmission parts based on receiving the signal and the identified zone associated with the UE. The UE may decode the one or more selected channel transmission parts, and may communicate based on the decoded channel transmission part or the decoded channel transmission parts.

30 Claims, 15 Drawing Sheets

(51) Int. Cl.
*H04W 72/04* (2009.01)
*H03M 13/09* (2006.01)

(52) U.S. Cl.
CPC ........ *H04L 5/0094* (2013.01); *H04L 25/0204* (2013.01); *H04L 25/0212* (2013.01); *H04W 72/0406* (2013.01); *H04W 72/048* (2013.01)

(58) Field of Classification Search
CPC ........... H04W 72/0406; H04W 72/048; H04W 72/06; H04W 72/1278
See application file for complete search history.

(56) References Cited

U.S. PATENT DOCUMENTS

2020/0413413 A1* 12/2020 Haghighat .......... H04L 27/2607
2021/0022115 A1* 1/2021 Miao ........................ H04W 4/46
2021/0243762 A1* 8/2021 Selvanesan ....... H04W 72/0493

OTHER PUBLICATIONS

International Search Report and Written Opinion—PCT/US2020/042590—ISA/EPO—dated Sep. 18, 2020 (194024WO).
LG Electronics: "Discussion on Physical Layer Structure for NR Sidelink", 3GPP Draft, 3GPP TSG RAN WG1 #97, R1-1907012, Discussion on physical layer structure for NR sidelink, 3rd Generation Partnership Project (3GPP), Mobile Competence Centre, 650, Route Des Lucioles, F-06921, Sophia-Antipolis Cedex, France, vol. RAN WG1, No. Reno, USA; May 13, 2019-May 17, 2019, May 13, 2019 (May 13, 2019), XP051728460, 25 pages, Retrieved from the Internet: URL: http://www.3gpp.org/ftp/Meetings%5F3GPP%5FSYNC/RAN1/Docs/R1%2D1907012%2Ezip [retrieved on May 13, 2019] pp. 5-12, 2.1.2. PSCCH design pp. 12-14, 2.1.3. PSFCH format for SFCI pp. 17-19, 2.1.7. Bandwidth part and resource pool pp. 19-20, 2.1.8. AGC and switching period consideration.
Mediatek Inc: "NR Sidelink Mode-1 Resource Allocation", 3GPP Draft, 3GPP TSG RAN1 WG1 Meeting #97, R1-1906554, NR Sidelink Mode-1 Resource Allocation, 3rd Generation Partnership Project (3GPP), Mobile Competence Centre, 650, Route Des Lucioles, F-06921, Sophia-Antipolis Cedex, France, vol. RAN WG1, No. Reno, USA, May 13, 2019-May 17, 2019, May 13, 2019 (May 13, 2019), XP051728005, 7 pages, Retrieved from the Internet: URL: http://www.3gpp.org/ftp/Meetings%5F3GPP%5FSYNC/RAN1/Docs/R1%2D1906554%2Ezip [retrieved on May 13, 2019] the whole document.
Mediatek Inc: "Zone-based Resource Allocation for NR V2X," 3GPP Draft, 3GPP TSG-RAN WG2 Meeting #106, R2-1906022, 3rd Generation Partnership Project (3GPP), Mobile Competence Centre, 650, Route Des Lucioles, F-06921, Sophia-Antipolis Cedex, France, vol. RAN WG2, No. Reno, Nevada, USA; May 13, 2019-May 17, 2019, May 13, 2019 (May 13, 2019), XP051729502, 3 pages, Retrieved from the Internet: URL: http://www.3gpp.org/ftp/Meetings%5F3GPP%5FSYNC/RAN2/Docs/R2%2D1906022%2Ezip [retrieved on May 13, 2019] the whole document.

* cited by examiner

ZONE-BASED SIGNALING IN NEW RADIO

CROSS REFERENCE

The present application for patent claims the benefit of U.S. Provisional Patent Application No. 62/881,671 by Chen et al., entitled "ZONE-BASED SIGNALING IN NEW RADIO," filed Aug. 1, 2019, assigned to the assignee hereof, and expressly incorporated by reference in its entirety herein.

BACKGROUND

The following relates generally to wireless communications, and more specifically to zone-based signaling in new radio (NR).

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as NR systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM).

A wireless multiple-access communications system may include a number of base stations or network access nodes, each simultaneously supporting communication for multiple communication devices, which may be otherwise known as user equipment (UE). Some wireless communications systems (for example, NR systems), may support high throughput and low latency communications. Some techniques for supporting high throughput and low latency communications, however, may be deficient in some implementations.

SUMMARY

The described techniques relate to improved methods, systems, devices, and apparatuses that support zone-based signaling in new radio (NR). Generally, the described techniques provide for enhancing reliability in communication links in NR systems. Specifically, the described techniques provide for zone-based signaling in wireless communications systems associated with high data rates and low latency. According to one or more aspects of the present disclosure, feedback (e.g., batch-based feedback) may be provided in which a user equipment (UE) may receive a signal including one or more channel transmission parts associated with one or more zones. For example, a geographic area may be partitioned into one or more zones, and a base station may indicate the partitioning information using the signal including the one or more channel transmission parts. Additionally or alternatively, the base station may map one or more channel transmission parts to one or more of the zones. The UE, based on receiving the signal, may identify at least one zone associated with the UE. In some cases, the UE may identify multiple zones associated with the UE. In some cases, the UE, based on identifying at least one zone, may select at least one channel transmission part of the one or more channel transmission parts. The UE may decode the selected at least one channel transmission part, and communicate using the decoded at least one channel transmission part.

A method of wireless communication at a first device is described. The method may include receiving, from a second device, a signal including one or more channel transmission parts associated with one or more zones, identifying, based on receiving the signal, at least one zone of the one or more zones that is associated with the first device, selecting, based on receiving the signal and at least one zone associated with the first device, a channel transmission part of the one or more channel transmission parts, and communicating, with the second device, based on selecting the channel transmission part.

An apparatus for wireless communication at a first device is described. The apparatus may include a processor, memory coupled with the processor, and instructions stored in the memory. The instructions may be executable by the processor to cause the apparatus to receive, from a second device, a signal including one or more channel transmission parts associated with one or more zones, identify, based on receiving the signal, at least one zone of the one or more zones that is associated with the first device, select, based on receiving the signal and at least one zone associated with the first device, a channel transmission part of the one or more channel transmission parts, and communicate, with the second device, based on selecting the channel transmission part.

Another apparatus for wireless communication at a first device is described. The apparatus may include means for receiving, from a second device, a signal including one or more channel transmission parts associated with one or more zones, identifying, based on receiving the signal, at least one zone of the one or more zones that is associated with the first device, selecting, based on receiving the signal and at least one zone associated with the first device, a channel transmission part of the one or more channel transmission parts, and communicating, with the second device, based on selecting the channel transmission part.

A non-transitory computer-readable medium storing code for wireless communication at a first device is described. The code may include instructions executable by a processor to receive, from a second device, a signal including one or more channel transmission parts associated with one or more zones, identify, based on receiving the signal, at least one zone of the one or more zones that is associated with the first device, select, based on receiving the signal and at least one zone associated with the first device, a channel transmission part of the one or more channel transmission parts, and communicate, with the second device, based on selecting the channel transmission part.

Some examples of the method, apparatuses, and non-transitory computer-readable medium described herein may further include operations, features, means, or instructions for decoding the channel transmission part to identify at least one code block, where communicating with the second device may be based on decoding the channel transmission part. Some examples of the method, apparatuses, and non-transitory computer-readable medium described herein may further include operations, features, means, or instructions for determining a correlation between the channel transmission part and the at least one zone associated with the first device, where selecting the channel transmission part may be based on the correlation.

Some examples of the method, apparatuses, and non-transitory computer-readable medium described herein may further include operations, features, means, or instructions for selecting a second channel transmission part based on receiving the signal and the at least one zone associated with the first device, and combining the channel transmission part and the second channel transmission part to generate a combined channel transmission part, where communicating with the second device may be based on the combined channel transmission part.

Some examples of the method, apparatuses, and non-transitory computer-readable medium described herein may further include operations, features, means, or instructions for determining a correlation between the second channel transmission part and the at least one zone associated with the first device, where selecting the second channel transmission part may be based on the correlation. Some examples of the method, apparatuses, and non-transitory computer-readable medium described herein may further include operations, features, means, or instructions for determining that the channel transmission part and the second channel transmission part may be separately encoded, where communicating with the second device may be based on the determining.

Some examples of the method, apparatuses, and non-transitory computer-readable medium described herein may further include operations, features, means, or instructions for identifying, based on receiving the signal, one or more flows associated with the one or more zones, where each flow of the one or more flows may be associated with a respective type of information related to the one or more zones, and selecting, based on identifying the one or more flows and the at least one zone associated with the first device, at least one flow of the one or more flows, where selecting the channel transmission part may be based on selecting the flow. In some examples of the method, apparatuses, and non-transitory computer-readable medium described herein, the respective type of information related to the one or more zones includes a mapping information associated with the one or more zones, an object information associated with the one or more zones, a text information associated with a set of objects in each of the one or more zones, a graphics information associated with a set of objects in each of the one or more zones, or a combination thereof.

In some examples of the method, apparatuses, and non-transitory computer-readable medium described herein, a quantity of flows in a first zone of the one or more zones may be different than a quantity of flows in a second zone of the one or more zones. In some examples of the method, apparatuses, and non-transitory computer-readable medium described herein, a quantity of flows in a first zone of the one or more zones may be the same as a quantity of flows in a second zone of the one or more zones.

In some examples of the method, apparatuses, and non-transitory computer-readable medium described herein, a type of flow in a first zone of the one or more zones may be different than a type of flow in a second zone of the one or more zones. Some examples of the method, apparatuses, and non-transitory computer-readable medium described herein may further include operations, features, means, or instructions for determining a cyclic redundancy check value associated with one or more information bits in the channel transmission part, where communicating with the second device may be based on determining the cyclic redundancy check value.

Some examples of the method, apparatuses, and non-transitory computer-readable medium described herein may further include operations, features, means, or instructions for selecting a second channel transmission part based on receiving the signal and the at least one zone associated with the first device, and determining a cyclic redundancy check value associated with a total quantity of information bits in the channel transmission part and the second channel transmission part, where communicating with the second device may be based on determining the cyclic redundancy check value.

Some examples of the method, apparatuses, and non-transitory computer-readable medium described herein may further include operations, features, means, or instructions for receiving, from the second device, a second signal indicating the one or more zones. Some examples of the method, apparatuses, and non-transitory computer-readable medium described herein may further include operations, features, means, or instructions for transmitting, to the second device in response to receiving the second signal, a third signal indicating the at least one zone associated with the first device, where selecting the channel transmission part may be based on transmitting the second signal.

In some examples of the method, apparatuses, and non-transitory computer-readable medium described herein, the signal and the second signal may be the same signal. In some examples of the method, apparatuses, and non-transitory computer-readable medium described herein, the second signal includes information related to a partitioning of the one or more zones. In some examples of the method, apparatuses, and non-transitory computer-readable medium described herein, the second signal may be a radio resource control signal.

In some examples of the method, apparatuses, and non-transitory computer-readable medium described herein, the signal and the second signal may be separate signals. In some examples of the method, apparatuses, and non-transitory computer-readable medium described herein, the channel transmission part and a second channel transmission part of the one or more channel transmission parts may be associated with the same physical downlink shared channel. In some examples of the method, apparatuses, and non-transitory computer-readable medium described herein, the channel transmission part and a second channel transmission part of the one or more channel transmission parts may be associated with different physical downlink shared channels.

In some examples of the method, apparatuses, and non-transitory computer-readable medium described herein, the channel transmission part and a second channel transmission part of the one or more channel transmission parts include overlapping information. In some examples of the method, apparatuses, and non-transitory computer-readable medium described herein, the signal including the one or more channel transmission parts may be periodic, event-triggered, or both.

In some examples of the method, apparatuses, and non-transitory computer-readable medium described herein, a periodicity of the signal may be based on a rate of change of information associated with the one or more zones, and a latency requirement associated with the first device. In some examples of the method, apparatuses, and non-transitory computer-readable medium described herein, the signal includes broadcast signal or a multicast signal or a unicast signal.

In some examples of the method, apparatuses, and non-transitory computer-readable medium described herein, the one or more channel transmission parts may be frequency-division multiplexed, time-division multiplexed, space-division multiplexed, or a combination thereof. In some examples of the method, apparatuses, and non-transitory computer-readable medium described herein, the one or more channel transmission parts may be interleaved or non-interleaved.

A method of wireless communication at a second device is described. The method may include transmitting, to a set of first devices, a signal including one or more channel transmission parts associated with one or more zones, identifying, based on transmitting the signal, at least one zone of the one or more zones that is associated with a first device of the set of first devices, and communicating, with the first device, based on a channel transmission part of the one or more channel transmission parts.

An apparatus for wireless communication at a second device is described. The apparatus may include a processor, memory coupled with the processor, and instructions stored in the memory. The instructions may be executable by the processor to cause the apparatus to transmit, to a set of first devices, a signal including one or more channel transmission parts associated with one or more zones, identify, based on transmitting the signal, at least one zone of the one or more zones that is associated with a first device of the set of first devices, and communicate, with the first device, based on a channel transmission part of the one or more channel transmission parts.

Another apparatus for wireless communication at a second device is described. The apparatus may include means for transmitting, to a set of first devices, a signal including one or more channel transmission parts associated with one or more zones, identifying, based on transmitting the signal, at least one zone of the one or more zones that is associated with a first device of the set of first devices, and communicating, with the first device, based on a channel transmission part of the one or more channel transmission parts.

A non-transitory computer-readable medium storing code for wireless communication at a second device is described. The code may include instructions executable by a processor to transmit, to a set of first devices, a signal including one or more channel transmission parts associated with one or more zones, identify, based on transmitting the signal, at least one zone of the one or more zones that is associated with a first device of the set of first devices, and communicate, with the first device, based on a channel transmission part of the one or more channel transmission parts.

Some examples of the method, apparatuses, and non-transitory computer-readable medium described herein may further include operations, features, means, or instructions for determining one or more flows associated with the one or more zones, where each flow of the one or more flows may be associated with a respective type of information related to the one or more zones, and where transmitting the signal further includes transmitting the one or more flows.

In some examples of the method, apparatuses, and non-transitory computer-readable medium described herein, the respective type of information related to the one or more zones includes a mapping information associated with the one or more zones, an object information associated with the one or more zones, a text information associated with a set of objects in each of the one or more zones, a graphics information associated with a set of objects in each of the one or more zones, or a combination thereof.

In some examples of the method, apparatuses, and non-transitory computer-readable medium described herein, a quantity of flows in a first zone of the one or more zones may be different than a quantity of flows in a second zone of the one or more zones. In some examples of the method, apparatuses, and non-transitory computer-readable medium described herein, a quantity of flows in a first zone of the one or more zones may be the same as a quantity of flows in a second zone of the one or more zones.

In some examples of the method, apparatuses, and non-transitory computer-readable medium described herein, a type of flow in a first zone of the one or more zones may be different than a type of flow in a second zone of the one or more zones. Some examples of the method, apparatuses, and non-transitory computer-readable medium described herein may further include operations, features, means, or instructions for transmitting, to the first device, a second signal indicating the one or more zones. Some examples of the method, apparatuses, and non-transitory computer-readable medium described herein may further include operations, features, means, or instructions for receiving, from the first device in response to transmitting the second signal, a third signal indicating the at least one zone associated with the first device.

In some examples of the method, apparatuses, and non-transitory computer-readable medium described herein, the signal and the second signal may be the same signal. In some examples of the method, apparatuses, and non-transitory computer-readable medium described herein, the second signal includes information related to a partitioning of the one or more zones. In some examples of the method, apparatuses, and non-transitory computer-readable medium described herein, the second signal may be a radio resource control signal.

In some examples of the method, apparatuses, and non-transitory computer-readable medium described herein, the signal and the second signal may be separate signals. In some examples of the method, apparatuses, and non-transitory computer-readable medium described herein, the channel transmission part and a second channel transmission part of the one or more channel transmission parts may be associated with the same physical downlink shared channel.

In some examples of the method, apparatuses, and non-transitory computer-readable medium described herein, the channel transmission part and a second channel transmission part of the one or more channel transmission parts may be associated with different physical downlink shared channels. In some examples of the method, apparatuses, and non-transitory computer-readable medium described herein, the channel transmission part and a second channel transmission part of the one or more channel transmission parts include overlapping information.

In some examples of the method, apparatuses, and non-transitory computer-readable medium described herein, the signal including the one or more channel transmission parts may be periodic, or event-triggered, or both. In some examples of the method, apparatuses, and non-transitory computer-readable medium described herein, a periodicity of the signal may be based on a rate of change of information associated with the one or more zones, and a latency requirement associated with the first device. In some examples of the method, apparatuses, and non-transitory computer-readable medium described herein, the signal includes a broadcast signal or a multicast signal or a unicast signal.

In some examples of the method, apparatuses, and non-transitory computer-readable medium described herein, the one or more channel transmission parts may be frequency-division multiplexed, time-division multiplexed, space-division multiplexed, or a combination thereof. In some examples of the method, apparatuses, and non-transitory computer-readable medium described herein, the one or more channel transmission parts may be interleaved or non-interleaved.

DETAILED DESCRIPTION

Figure 1:
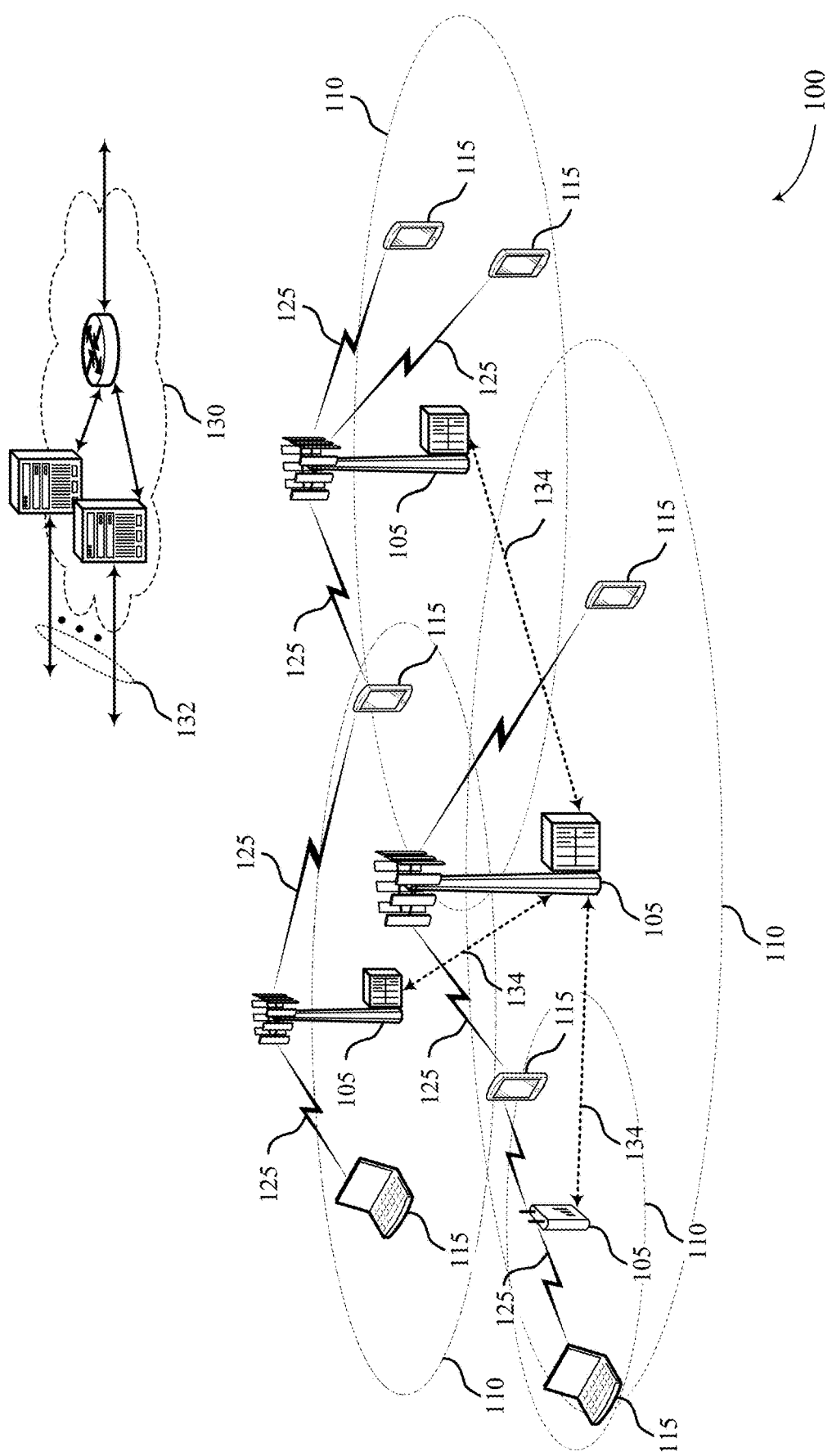
FIG. 1 illustrates an example of a wireless communications system that supports zone-based signaling in new radio (NR) in accordance with aspects of the present disclosure.

A user equipment (UE) in a wireless communications system, such as a New Radio (NR) system or a Long Term Evolution (LTE) system, may support applications associated with high throughput and low latency. Specifically, wireless communications systems supporting extended reality (XR) applications may be associated with high data rate requirements and a tight delay budget. This imposes challenges to wireless communications systems to provide high data rates with low latency while maximizing cell efficiencies. Some described aspects of the disclosure relate to improved methods, systems, devices, or apparatuses that facilitate zone-based signaling in NR systems. In some applications, UEs located in a common geographic area may share some similar communication needs. Other wireless communications systems may not provide for some signals, such as a multicast, unicast, or broadcast signals, for a group of UEs located in a common zone, such as in the same room or same area. One or more aspects of the present disclosure provide for signals for a set of UEs in the same zone, as an alternative to using unicast with dedicated resources for each UE of the set of UEs. Thus, the present disclosure relates to introducing mechanisms to organize transmissions, such as broadcast or multicast transmissions, into one or more channel transmission parts, where the one or more channel transmission parts may be mapped to different zones. In some examples, the different zones may be mapped within a geographic area.

In some examples, the techniques described herein may enable a UE in the wireless communications system supporting XR applications to receive a signal including one or more channel transmission parts associated with one or more zones, e.g., in a geographic area. In some cases, a base station may partition a geographic area into one or more zones, and may map one or more channel transmission parts to at least some of the one or more zones (for example, one or more channel transmission parts mapped to a respective one or more zones). In some cases, the base station may use separate signals to indicate a partitioning of the one or more zones and the one or more channel transmission parts. Alternatively, the base station may use a same signal to indicate one or more of the partitioning of the one or more zones or the one or more channel transmission parts. The UE may receive the signal, and may identify at least one zone associated with the UE. In some cases, the UE may identify multiple zones associated with the UE. For example, the UE may identify multiple zones included in the one or more zones indicated by the base station. The UE may be configured to identify the one or more zones, e.g., based on a geographic location of the UE. In some cases, based on identifying the at least one zone, the UE may a select at least one channel transmission part of the one or more channel transmission parts. In some cases, the UE may select multiple channel transmission parts, where each channel transmission part may correspond to a respective zone selected by the UE. According to one or more aspects, the UE may decode the selected channel transmission part (or multiple channel transmission parts) and communicate based on the decoded channel transmission part.

Aspects of the disclosure are initially described in the context of a wireless communications system. Aspects of the disclosure are further illustrated by and described with reference to apparatus diagrams, system diagrams, and flowcharts that relate to zone-based signaling in NR.

FIG. 1 illustrates an example of a wireless communications system 100 that supports zone-based signaling in NR in accordance with aspects of the present disclosure. The wireless communications system 100 includes base stations 105, UEs 115, and a core network 130. In some examples, the wireless communications system 100 may be an LTE network, an LTE-Advanced (LTE-A) network, an LTE-A Pro network, or an NR network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation NodeB or giga-NodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. In some examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples, half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1, N2, N3, or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that may be capable of tolerating interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a carrier aggregation configuration in conjunction with component carriers operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving device is equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g., synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples, a receiving device may use a single receive beam to receive along a single beam direction (e.g., when receiving a data signal). The single receive beam may be aligned in a beam direction determined based on listening according to different receive beam directions (e.g., a beam direction determined to have a highest signal strength, highest signal-to-noise ratio, or otherwise acceptable signal quality based on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200\ T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases, a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an evolved universal mobile telecommunication system terrestrial radio access (E-UTRA) absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency division multiplexing (OFDM) or discrete Fourier transform spread OFDM (DFT-S-OFDM)).

The organizational structure of the carriers may be different for different radio access technologies (e.g., LTE, LTE-A, LTE-A Pro, NR). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs 115 that support simultaneous communications via carriers associated with more than one different carrier bandwidth.

Wireless communications system 100 may support communication with a UE 115 on multiple cells or carriers, a feature which may be referred to as carrier aggregation or multi-carrier operation. A UE 115 may be configured with multiple downlink component carriers and one or more uplink component carriers according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other component carriers, which may include use of a reduced symbol duration as compared with symbol durations of the other component carriers. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may consist of one or multiple symbol periods. In some cases, the TTI duration (that is, the number of symbol periods in a TTI) may be variable.

Wireless communications system 100 may be an NR system that may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across the frequency domain) and horizontal (e.g., across the time domain) sharing of resources.

Existing wireless communications systems lack the ability for robust signaling for high throughput and low latency applications. Specifically, wireless communications systems supporting XR applications may be associated with high data rate requirements and a tight delay budget. This imposes challenges to existing wireless communications system to satisfy these requirements while maximizing cell efficiencies. Multiple UEs may share some similar communication needs. For example, multiple UEs may share one or more of a common geographic location, a common beamforming direction, common surroundings (e.g., virtually or physically), or the like and thus may have similar communication needs. Existing methods for communicating with multiple UEs located in a common zone may however be deficient.

To overcome the limitation of the existing wireless communications system, according to one or more aspects of the present disclosure, the wireless communications system 100 may be configured to provide for a multicast or broadcast signal for UEs 115 located in a common zone (such as in the same room or same location). In some examples, a UE 115 in the wireless communications system 100 may receive a signal including one or more channel transmission parts associated with one or more zones, e.g., within a geographic area. In some cases, a base station 105 may map one or more channel transmission parts to each zone of the one or more zones, and may indicate the one or more channel transmission parts and the one or more zones. The UE 115 may receive the signal, and may identify at least one zone associated with the UE 115. In some cases, the UE 115 may identify multiple zones associated with the UE 115. In some cases, the UE 115 may be configured to identify the one or more zones. In some cases, the UE 115 may be configured to identify the one or more zones based on a geographic location of the UE 115. In some cases, based on identifying the at least one zone, the UE 115 may a select channel transmission part of the one or more channel transmission parts, and may communicate using the selected channel transmission part (or multiple channel transmission parts).

Figure 2:
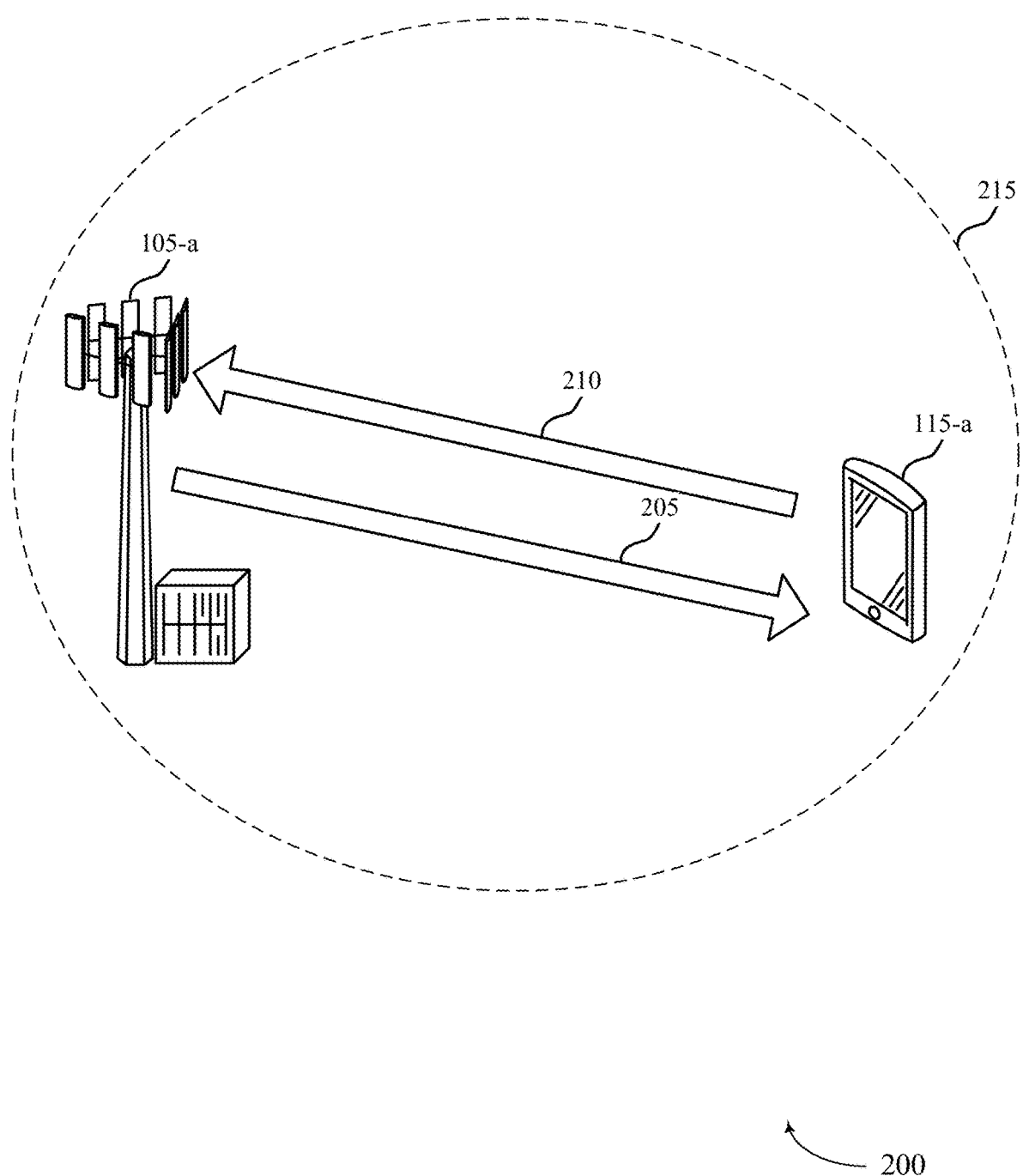
FIG. 2 illustrates an example of a wireless communications system that supports zone-based signaling in NR in accordance with aspects of the present disclosure.

FIG. 2 illustrates an example of a wireless communications system 200 that supports zone-based signaling in NR in accordance with aspects of the present disclosure. In some examples, the wireless communications system 200 may implement aspects of wireless communications system 100. The wireless communications system 200 may include a base station 105-*a* (e.g., second device) and a UE 115-*a* (e.g., first device), which may be examples of the corresponding devices as described with reference to FIG. 1. In some examples, the base station 105-*a* may be referred to as a transmitter (e.g., a transmitting device) and the UE 115-*a* may be referred to as a receiver (e.g., a receiving device). In some examples, a second UE (not shown) may serve as a transmitting device. In some implementations, the UE 115-*a* and the base station 105-*a* may operate in a mmW spectrum, using NR technologies, or both.

In some wireless systems (for example, NR wireless systems, such as wireless communications system 200), the UE 115-*a* and the base station 105-*a* may support low latency and high throughput communications. In some examples, different types of communications may entail different traffic thresholds. As described herein, Table 1 represents a table showing different traffic thresholds for different types of traffic in an NR wireless system. For example, an NR system (such as, wireless communications system 200) may support eMBB applications, ultra-reliable low latency communications (URLLC), and XR communications. Various applications and/or communications may be associated with various traffic thresholds. For example, the traffic threshold may include a quality of service value, a packet delay budget, a packet error rate, a default, maximum data burst volume, or a combination thereof. In some implementations, one or more XR applications (for example, applications using traffic thresholds associated with XR applications) may include cloud reality applications, virtual reality applications, gaming applications, etc. As discussed herein, the XR applications may be associated with a high throughput (for example, throughput for rendering videos) and a low latency. That is, such XR applications may be associated with a high bit rate, a high reliability, and a low latency. In some implementations, the XR applications may also include interactive video sessions (such as, for gaming or head mounted displays). As described with reference to Table 1, each XR application may be associated with a packet delay budget and a packet error rate. For example, an XR application (or an XR communication session) may be associated with a packet delay budget ranging between 5 ms and 25 ms (for example, 10 ms) and a packet error rate less than or equal to $10^{-3}$ (such as, $10^{-6}$).

TABLE 1

| Traffic Type | 5QI Value | Packet Delay Budget | Packet Error Rate | Default Maximum Data Burst Volume | Example Services |
|---|---|---|---|---|---|
| eMBB | 1 | 100 ms | $10^{-2}$ | N/A | Conversational voice |
| eMBB | 2 | 150 ms | $10^{-3}$ | N/A | Conversational video (for example, live streaming) |
| eMBB | 6, 8, 9 | 300 ms | $10^{-6}$ | N/A | Video (for example, buffered streaming) Transmission Control Protocol-based service (for example, e-mail, chat, file transfer protocol, peer-to-peer file sharing, progressive video) |
| ... | ... | ... | ... | ... | ... |
| XR | 80 | 10 ms | $10^{-6}$ | N/A | Low latency eMBB applications (such as, augmented reality) |
| URLLC | 81 | 5 ms | $10^{-5}$ | 160 B | Remote control |
| ... | ... | ... | ... | ... | ... |

Additionally, Table 2 illustrates multiple use cases for XR applications. For example, an XR application may include virtual reality split rendering (for example, for gaming applications). In such implementations, a head mounted display may be attached with a server that renders a video frame. In such examples, a processing of the video frame may be performed at the server (such as, a server hosting XR applications). Upon successful processing of the video frame, a communication link (such as, a 5G communication link) may convey the processed video frame from the server to the head mounted display. For a successful delivery of the processed video frame in XR applications, the 5G communication link may be associated with a high throughput and a low latency (for example, a high traffic threshold for XR applications). Additionally or alternatively, a second use case for XR applications may include augmented reality split computation. In augmented reality applications, an entire view of a user may not be covered by a rendered video. Instead, a rendered video (such as, video rendered from a server) may be augmented over a display of a user device (for example, a camera feed). As depicted in Table 2, a third use case for XR applications may include cloud gaming. In some examples, cloud gaming may be associated with a high throughput and a low latency communication link. In sum, XR applications may be subjected to higher traffic thresholds, and it may be beneficial for the NR wireless communications system (such as, wireless communications system 200) to support zone-based signaling for the traffic associated with XR applications.

TABLE 2

|  | Virtual Reality split rendering | Augmented Reality split computation | Cloud Gaming |
|---|---|---|---|
| Head Mounted Display/Device | Head-mounted with 5G modem attached | Head-mounted with USB/Bluetooth connection to "Puck" or Smartphone with 5G modem | 5G Smartphone or Tablet |
| 5G usage Location | QoS Enterprise-Indoor, Residential-Indoor, Outdoor | QoS Enterprise-Indoor, Outdoor | OTT/QoS Outdoor |
| Mobility | Limited to head movements and restricted body movements, Hi-speed (VR in the back of a car) | Pedestrian, Hi-speed | Static, Hi-speed |

Existing wireless communications system are configured to treat data packets as a stream of bits without the knowledge of the recipients of the packets. In some examples, XR applications may have very high data rate requirements (e.g., tens or hundreds of Mbps) and a tight delay budget (e.g., 10 ms). This imposes challenges to existing wireless networks to satisfy these requirements while maximizing cell efficiencies. In some XR applications, multiple UEs may be located in the same room or the same location (e.g., a same zone). In such scenarios, different UEs may share some similar communication needs. In some cases, multiple UEs located in the same zone (e.g., geographic area) may have the same communication needs. Current wireless communications system do not provide for a common signaling for UEs located in a common zone (such as, in the same room or same geographic location). In some wireless communications systems, a base station provides dedicated resources (using unicast signaling techniques) to each of the UEs located in a common zone. Existing wireless communications do not have a method to support enhanced methods for signaling to a group of UEs located in a common zone.

To overcome the limitations of the existing wireless communications systems, according to one or more aspects of the present disclosure, the wireless communications system 200 may be configured to provide for broadcast or multicast of signals for the set of UEs in the same zone. For example, the wireless communications system 200 may provide for a broadcast signal or a multicast signal to multiple UEs instead of using unicast with dedicated resources for each UE. Thus, one or more aspects of the present disclosure provide for increasing the efficiency of communications in an NR system (such as, an NR system supporting XR applications) by transmitting a broadcast signal or a multicast signal to multiple UEs (such as, multiple UEs located in a common zone). According to one or more aspects, the present disclosure provides for mechanisms to organize broadcast or multicast transmissions into two or more channel transmission parts, where one or more channel transmission parts correspond to different zones (such as, zones within a geographic area). Additionally, the present disclosure provides for multiple flows per zone, where each flow includes a different type of information pertaining to a zone.

According to one or more aspects of the present disclosure, the base station 105-*a* may transmit a signal including one or more channel transmission parts associated with one or more zones within a geographic area 215. In some examples, the base station 105-*a* may partition the geographic area 215 into multiple zones. Alternatively, the base station 105-*a* may receive an indication of the partitioning of the zones. In some cases, if the partitioning of the zones changes at a rate which is lower than a threshold, then the base station 105-*a* may use a separate signal to indicate the partitioning of the zones. In some cases, the base station 105-*a* may associate at least one channel transmission part with each zone. The base station 105-*a* may also group resources associated with each zone into one or more channel transmission parts. Upon determining the one or more channel transmission parts, the base station 105-*a* may indicate (via signal 205) the channel transmission parts to the UE 115-*a*. In some cases, signal 205 may be a unicast signal or a broadcast signal or a multicast signal. Although a single UE 115-*a* is depicted herein, it may be understood that the base station 105-*a* may simultaneously transmit the signal 205 (i.e., the signal including the one or more channel transmission parts) to multiple UEs 115 located within the geographic area 215. In some examples, the base station 105-*a* may transmit one or more channel transmission parts using a semi-static signaling (e.g., radio resource control signal) or dynamic signaling.

In some cases, the transmission of the one or more channel transmission parts (such as, via signal 205) can be periodic or event triggered. In some examples, the base station 105-*a* may decide to transmit (or retransmit) the signal including the channel transmission parts when a new UE 115 joins the system associated with the base station 105-*a* (i.e., served by the base station 105-*a*) and selects a zone associated with the newly joined UE 115 (i.e., the newly joined UE 115 indicates an interest in reception of channel transmission parts). According to one or more examples, a periodicity of the signal 205 (i.e., the signal including the one or more channel transmission parts) may be based on a rate of change of information associated with the one or more zones, and a latency requirement associated with the UE 115-*a* (or UEs 115 located within the geographic area 215). That is, the base station 105-*a* may determine a periodicity of the signal 205 based on a rate of change of information (such as a rate at which objects within the zone are changing), and time by which the change of information has to be available at the UE 115-*a*.

In some examples, prior to transmitting the signal 205 including the one or more channel transmission parts, the base station 105-*a* may transmit another signal indicating the zones (such as, partitioning of the zones) within the geographic area 215. According to one or more aspects of the present disclosure, the partitioning of the zones may have a partial overlap, such that two or more channel transmission parts may share some common information. That is, there may be redundancy across multiple zones. A UE 115-*a* may receive the signal indicating the zones, and may select a zone associated with the UE 115-*a*. In some cases, the UE 115-*a* may select the zone within which the UE 115-*a* is located. In one or more examples, the base station 105-*a* may use the same signal 205 to indicate the zones as well as the one or more channel transmission parts. Alternatively, the base station 105-*a* may transmit different signals to indicate the zones as well as the one or more channel transmission parts. In examples where the base station 105-*a* uses different signals, upon receiving a signal indicating the zones, the UE 115-*a* may transmit a signal 210 to indicate the selection of the zone. The base station 105-*a* may transmit the one or more channel transmission parts associated with one or more zones based on receiving the signal 210 from the UE 115-*a*.

In some cases, the UE 115-*a* may select a channel transmission part from the one or more channel transmission parts. In some cases, the selection may be based on a correlation between the channel transmission part and the selected zone associated with the UE 115-*a*. In some cases, the channel transmission part may be self-decodable. In some examples, the one or more channel transmission parts may be frequency-division multiplexed, time-division multiplexed, space-division multiplexed, or a combination thereof. In some examples, two or more channel transmission parts may be jointly or separately encoded. In some examples, if MIMO is supported, then a first channel transmission part may be included in a first layer while a second channel transmission part may be included in a second layer. Additionally or alternatively, a resource mapping for two channel transmission parts can be different for interleaved and non-interleaved channel transmission parts. In a non-interleaved example, all symbols of a first channel transmission part may be followed by all symbols of a second channel transmission part. In an interleaved example, the resource may be mapped according to {1, 0}, {2, 0}, {1, 1}, {2, 1}, {1, 2}, {2, 2}, ..., where {m, n}: m is the channel transmission part index and n is the symbol index within a channel transmission part.

In some aspects, the UE 115-*a* may identify at least one channel transmission part associated with the identified zone, and may communicate with the base station 105-*a* using the resources included in the identified channel transmission part. Specifically, the UE 115-*a* may be configured to decode a subset of the channel transmission parts (i.e., the channel transmission parts indicated in the signal 205), and combine them into a single information stream. For example, the UE 115-*a* may identify one or more zones associated with the UE 115-*a*, and may select multiple channel transmission parts associated with the identified zones. In some examples, the UE 115-*a* may decode a first channel transmission part and a second channel transmission part. Upon decoding the channel transmission parts, the UE 115-*a* may be configured to combine the decoded information into a single information stream.

According to some aspects of the present disclosure, the transmission of information bits of each channel transmission part may have an associated cyclic redundancy check value. Additionally or alternatively, the base station 105-*a* may also apply a cyclic redundancy check to a total number of information bits of all channel transmission parts included in the signal 205. In some cases, the UE 115-*a* may determine a cyclic redundancy check value associated with one or more information bits in a selected channel transmission part. Additionally or alternatively, the UE 115-*a* may select multiple channel transmission parts associated with multiple zones (such as, one channel transmission part associated with a zone, or multiple channel transmission parts associated with a zone, or multiple channel transmission parts associated with multiple zones or a combination thereof). In such an example, the UE 115-*a* may determine a cyclic redundancy check value associated with a total quantity of information bits in a first channel transmission part and the second channel transmission part (i.e., a total number of information bits of all channel transmission parts). In some examples, the two or more channel transmission parts may utilize the same physical downlink shared channel or separate physical downlink shared channels.

Additionally or alternatively, the UE 115-*a* may identify one or more flows associated with the one or more zones. In some cases, the base station 105-*a* may indicate the one or more flows using the signal 205. In some cases, the base station 105-*a* may indicate the one or more flows using a separate signal (not shown). In some cases, each flow of the one or more flows may be associated with a respective type of information related to the one or more zones. For example, the respective type of information related to the one or more zones may include a mapping information associated with the one or more zones, an object information associated with the one or more zones, a text information associated with a plurality of objects in each of the one or more zones, a graphics information associated with a plurality of objects in each of the one or more zones, or a combination thereof. Upon receiving the signal including the one or more flows, the UE 115-*a* may select at least one flows of the one or more flows. In some cases, the UE 115-*a* may select multiple flows from the one or more flows indicated in the signal. The UE 115-*a* may select multiple flows and multiple zones, and select the corresponding channel transmission parts based on selecting the multiple flows and the multiple zones. As previously discussed, the number of flows may be different in different zones, and the types of flows may be different in different zones. Additionally or alternatively, the periodicity of channel transmission parts associated with different flows may be different. In some cases, a trigger condition for channel transmission parts associated with different flows may be different. Thus, one or more aspects of the present disclosure provide for mechanisms for organizing broadcast or multicast transmissions into one or more channel transmission parts corresponding to one or more zones within a geographic area.

Figure 3:
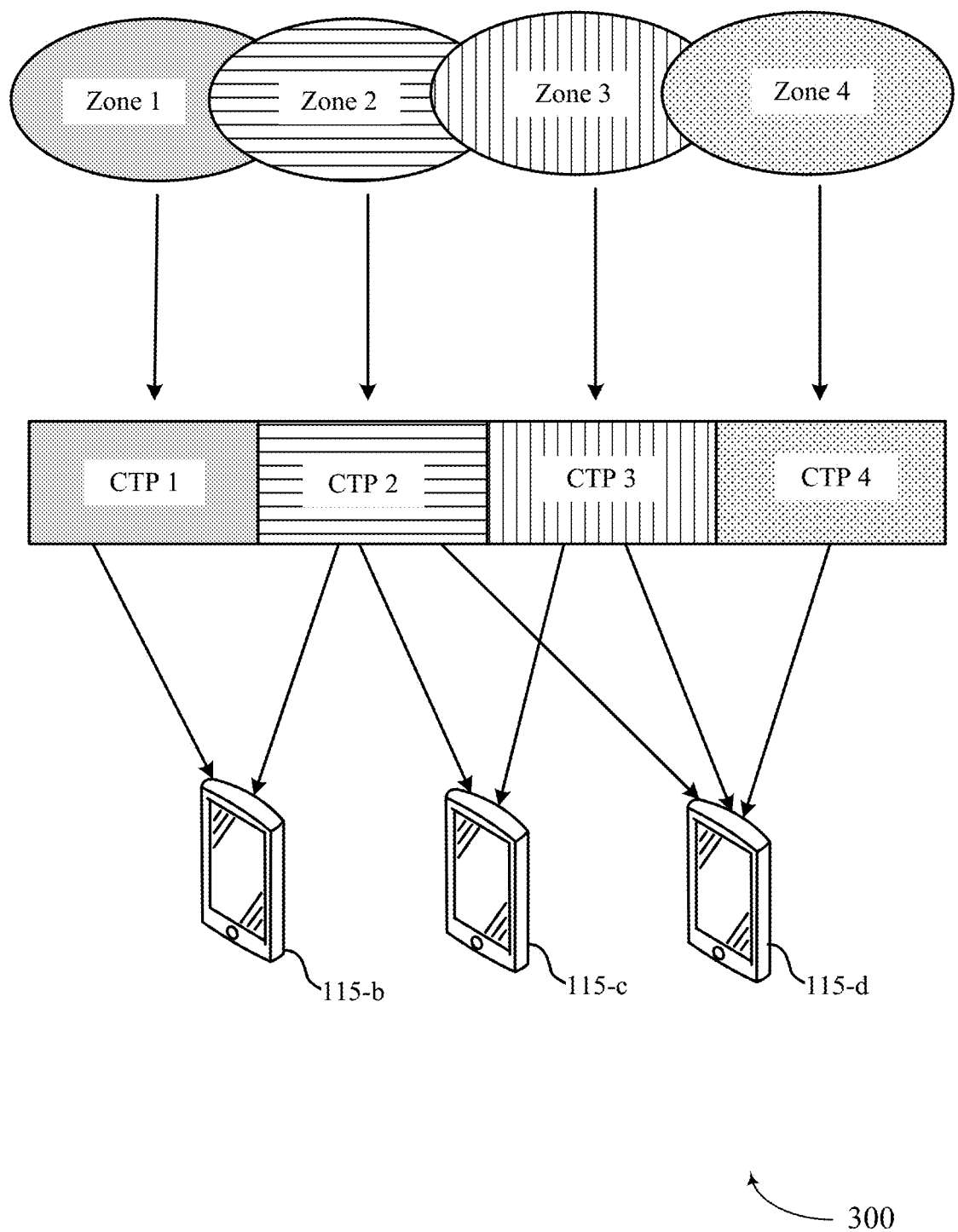
FIG. 3 illustrates an example of a signaling that supports zone-based signaling in NR in accordance with aspects of the present disclosure.

FIG. 3 illustrates an example of a signaling 300 that supports zone-based signaling in NR in accordance with aspects of the present disclosure. In some examples, the signaling 300 may be implemented using aspects of wireless communications system 100 and wireless communications system 200. The signaling 300 may include UEs 115-*b*, 115-*c*, and 115-*d*, which may be examples of the corresponding devices described with reference to FIGS. 1 and 2. Base station 105 (not shown) and the UEs 115-*b*, 115-*c*, and 115-*d* may support signaling (such as unicast, multicast, or broadcast) indicating zone-based partitioning in NR to achieve resource savings while maintaining delay requirements of NR systems.

According to one or more aspects of the present disclosure, a location may be partitioned into multiple zones. As depicted in the example of FIG. 3, a geographic area is partitioned into four zones (e.g., Zone 1, Zone 2, Zone 3, and Zone 4). As previously described, each zone may be associated with one or more channel transmission parts. Although the example of FIG. 3 illustrates a one-to-one correspondence between a zone and a channel transmission part, it may be understood that multiple channel transmission parts may be related to a single zone. In some cases, the UEs 115-*b*, 115-*c*, and 115-*d* may be located in a common geographic area. That is, each of the UEs 115-*b*, 115-*c*, and 115-*d* may be associated with at least one zone of the four zones (i.e., Zone 1, Zone 2, Zone 3, and Zone 4). The UEs 115-*b*, 115-*c*, and 115-*d* may receive a signal (not shown) indicating one or more channel transmission parts associated with the one or more zones (e.g., Zone 1, Zone 2, Zone 3, and Zone 4) e.g., within a geographic area. Upon receiving the signal, each UE 115 may identify a zone within which the UE is located. In the example of FIG. 3, the UE 115-*b* may identify that Zone 1 and Zone 2 are associated with the UE 115-*b*. Similarly, the UE 115-*c* may identify that Zone 2 and Zone 3 are associated with the UE 115-*c*, and the UE 115-*d* may identify that Zone 2, Zone 3, and Zone 4 are associated with the UE 115-*d*.

As previously discussed, the base station 105 may send a channel transmission part including information pertaining to each zone. Based on receiving the signal and identifying the zones associated with each UE, each UE (such as, UEs 115-*b*, 115-*c*, and 115-*d*) may select at least a channel transmission part of the one or more channel transmission parts (i.e., out of channel transmission part (CTP) 1, CTP 2, CTP 3, and CTP 4). In the example of FIG. 3, the UE 115-*b* may select CTP 1 and CTP 2 corresponding to Zone 1 and Zone 2, and the UE 115-*c* may select CTP 2 and CTP 3 corresponding to Zone 2 and Zone 3. Additionally, the UE 115-*d* may select CTP 2, CTP 3, and CTP 4 corresponding to Zone 2, Zone 3, and Zone 4. In some examples, each UE (such as, UEs 115-*b*, 115-*c*, and 115-*d*) may decode the channel transmission parts, and may communicate using the resources included in the channel transmission parts.

According to one or more aspects of the present disclosure, a UE 115 (such as, UEs 115-*b*, 115-*c*, and 115-*d*) may identify one or more channel transmission parts associated with a zone in which the UE 115 is located. In one example, the UE 115 may select a first set of channel transmission parts associated with the zone and a second set of channel transmission parts associated with the zone. In this case, the first set of channel transmission parts may provide different information than the second set of channel transmission parts. The UE 115 may then utilize the first set of channel transmission parts and the second set of channel transmission parts to determine a complete set of information associated with the zone. In one example, the UE 115 may select a first set of channel transmission parts based on a location of the UE 115 within the zone. For example, the UE 115 may identify a location of the UE 115 within the zone, and may determine that the first set of channel transmission parts includes information pertaining to that location within the zone (i.e., the location at which the UE 115 is located). Upon determining the first set of channel transmission parts, the UE 115 may decode the first set of channel transmission parts, and communicate using the first set of channel transmission parts.

According to an example of a surround sound environment, a base station 105 may configure the one or more channel transmission parts to include various audio files. A base station 105 may divide a surround sound environment into multiple zones (e.g., a zone for an area of a room), and may determine the channel transmission parts associated with each zone. In one example, a room may be divided into four areas (or zones). In such cases, a channel transmission part associated with a zone in the first area may include audio files generated at the first area, a channel transmission part associated with a zone in the second area may include audio files generated at the second area, a channel transmission part associated with a zone in the third area may include audio files generated at the third area, and a channel transmission part associated with a zone in the fourth area may include audio files generated at the fourth area. In such an example, to achieve a surround sound, a UE 115 may identify the four zones in the room. The UE 115 may then select each channel transmission part associated with each of the four zones (i.e., to receive the audio files generated in all four zones of the room). In this example, the UE 115 may select four channel transmission parts and may receive the data (such as, audio files) included in the four channel transmission parts.

Figure 4:
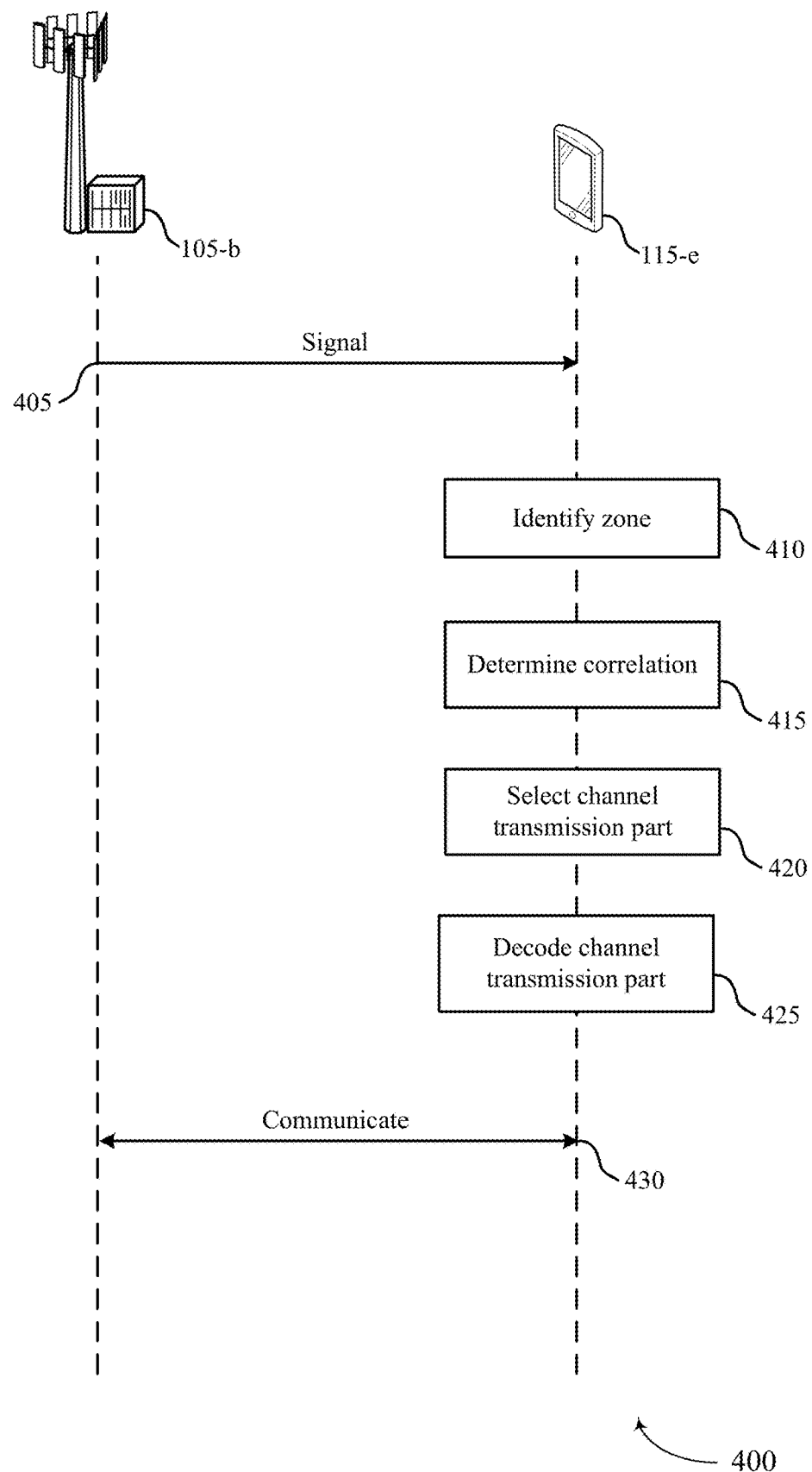
FIG. 4 illustrates an example of a process flow that supports zone-based signaling in NR in accordance with aspects of the present disclosure.

FIG. 4 illustrates an example of a process flow 400 that supports zone-based signaling in NR in accordance with aspects of the present disclosure. In some examples, the process flow 400 may implement aspects of wireless communications system 100 and wireless communications system 200. The process flow 400 may include base station 105-*b* (e.g., second device) and UE 115-*e* (e.g., first device), which may be examples of the corresponding devices described with reference to FIGS. 1 through 3. Base station 105-*b* and UE 115-*e* may support broadcast or multicast signaling indicating zone-based partitioning in NR to achieve resource savings while maintaining delay requirements of NR systems.

In the following description of the process flow 400, the operations between the UE 115-*e* and the base station 105-*b* may be transmitted in a different order than the exemplary order shown. The operations performed by UE 115-*e* or base station 105-*b* may be performed in different orders or at different times than the exemplary order shown. Some operations may also be left out of the process flow 400, or other operations may be added to the process flow 400. Further, base station 105-*b* and UE 115-*e* are not meant to be representative, as the described features may be associated with any number of devices.

At 405, the UE 115-*e* may receive, from the base station 105-*b* a signal including one or more channel transmission parts associated with one or more zones within a geographic area. For example, the base station 105-*b* may partition the geographic area into multiple zones. In some examples, the base station 105-*b* may associate at least one channel transmission part with each zone. The base station 105-*b* may then indicate the information associated with the zones using the signal at 405. In some cases, the base station 105-*b* may also indicate the channel transmission parts using the signal at 405. In some examples, the base station may indicate the information associated with the zones and the channel transmission parts using the same signal. Alternatively, the base station may indicate the information associated with the zones and the channel transmission parts using separate signals (not shown). In some examples, the signal at 405 may be a broadcast signal or a multicast signal or a unicast signal.

At 410, the UE 115-*e* may identify at least one zone of the one or more zones that is associated with the UE 115-*e*. In some cases, the UE 115-*e* may identify the at least one zone based on receiving the signal at 405. In some examples, the UE 115-*e* may identify the at least one zone based on the geographic location of the UE 115-*e*.

At 415, the UE 115-*e* may determine a correlation between a channel transmission part and the at least one zone associated with the UE 115-*e*. At 420, then UE 115-*e* may select the channel transmission part of the one or more channel transmission parts. In some cases. the UE 115-*e* may select the channel transmission part based on receiving the signal at 405 and the at least one zone associated with the UE 115-*e*. According to some aspects, selecting the channel transmission part may be based on the correlation between the channel transmission part and the at least one zone where the UE 115-*e* is located.

At 425, the UE 115-*e* may decode the channel transmission part to identify at least one code block. In some examples, in order to decode the channel transmission part, the UE 115-*e* may determine that the channel transmission part is self-decodable (e.g., there is at least one code block within the channel transmission part). At 430, the UE 115-*e* may communicate with the base station 105-*b* based on selecting the channel transmission part. In some cases, the UE 115-*e* may communicate with the base station 105-*b* based on decoding the channel transmission part.

The operations performed by the base station 105-*b* and the UE 115-*b*, as part of, but not limited to, process flow 400 may provide improvements to communication links in wireless communications systems. Further, the operations performed by the base station 105-*b* and the UE 115-*e* as part of, but not limited to, process flow 400 may provide benefits and enhancements to the operation of the UE 115-*e* while performing communications with a high throughput and low latency. For example, the described methods in the process flow 400 may support enhanced throughput and resource savings in XR applications, among other advantages.

Figure 5:
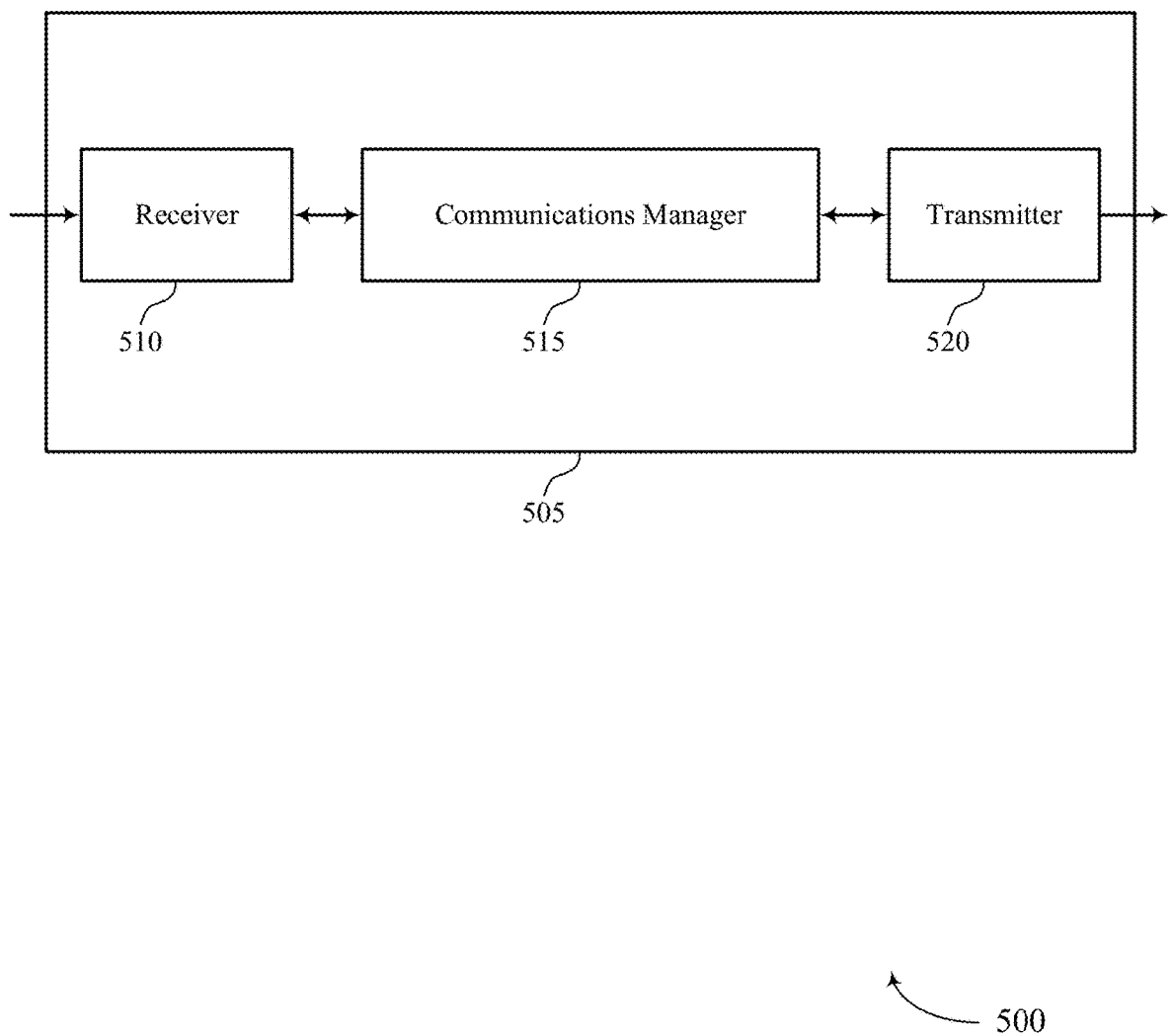
FIGS. 5 and 6 show block diagrams of devices that support zone-based signaling in NR in accordance with aspects of the present disclosure.

FIG. 5 shows a block diagram 500 of a device 505 that supports zone-based signaling in NR in accordance with aspects of the present disclosure. The device 505 may be an example of aspects of a UE 115 (e.g., first device) as described herein. The device 505 may include a receiver 510, a communications manager 515, and a transmitter 520. The device 505 may also include a processor. Each of these components may be in communication with one another (e.g., via one or more buses).

The receiver 510 may receive information such as packets, user data, or control information associated with various information channels (e.g., control channels, data channels, and information related to zone-based signaling in NR, etc.). Information may be passed on to other components of the device 505. The receiver 510 may be an example of aspects of the transceiver 820 described with reference to FIG. 8. The receiver 510 may utilize a single antenna or a set of antennas.

The communications manager 515 may receive, from a second device, a signal including one or more channel transmission parts associated with one or more zones. The communications manager 515 may identify, based on receiving the signal, at least one zone of the one or more zones that is associated with a first device. The communications manager 515 may select, based on receiving the signal and the at least one zone associated with the first device, a channel transmission part of the one or more channel transmission parts. The communications manager 515 may communicate, with the second device, based on selecting the channel transmission part. The communications manager 515 may be an example of aspects of the communications manager 810 described herein.

The communications manager 515, or its sub-components, may be implemented in hardware, code (e.g., software or firmware) executed by a processor, or any combination thereof. If implemented in code executed by a processor, the functions of the communications manager 515, or its sub-components may be executed by a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described in the present disclosure.

The communications manager 515, or its sub-components, may be physically located at various positions, including being distributed such that portions of functions are implemented at different physical locations by one or more physical components. In some examples, the communications manager 515, or its sub-components, may be a separate and distinct component in accordance with various aspects of the present disclosure. In some examples, the communications manager 515, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 520 may transmit signals generated by other components of the device 505. In some examples, the transmitter 520 may be collocated with a receiver 510 in a transceiver module. For example, the transmitter 520 may be an example of aspects of the transceiver 820 described with reference to FIG. 8. The transmitter 520 may utilize a single antenna or a set of antennas.

Figure 6:
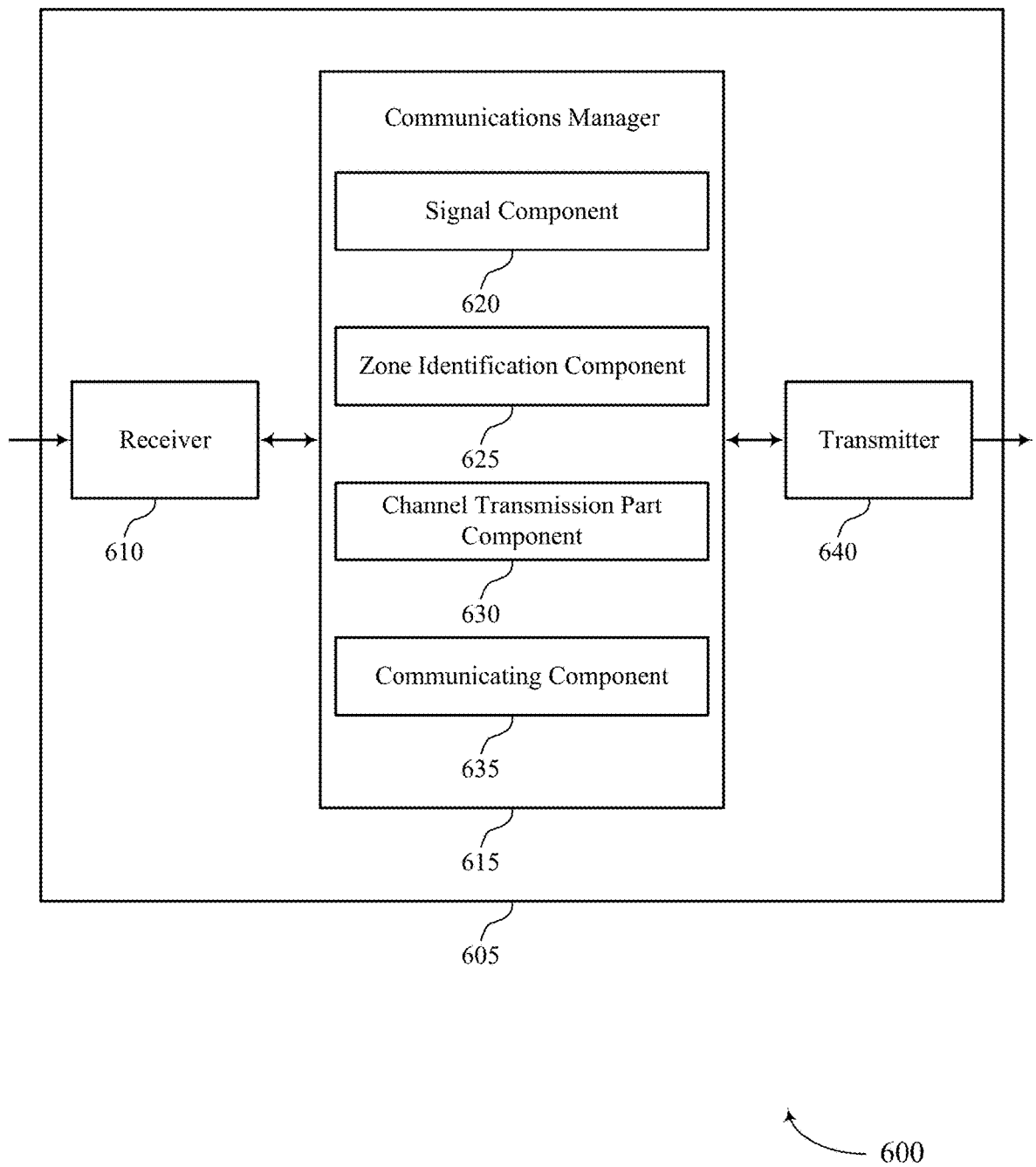

FIG. 6 shows a block diagram 600 of a device 605 that supports zone-based signaling in NR in accordance with aspects of the present disclosure. The device 605 may be an example of aspects of a device 505, or a UE 115 as described herein. The device 605 may include a receiver 610, a communications manager 615, and a transmitter 640. The device 605 may also include a processor. Each of these components may be in communication with one another (e.g., via one or more buses).

The receiver 610 may receive information such as packets, user data, or control information associated with various information channels (e.g., control channels, data channels, and information related to zone-based signaling in NR, etc.). Information may be passed on to other components of the device 605. The receiver 610 may be an example of aspects of the transceiver 820 described with reference to FIG. 8. The receiver 610 may utilize a single antenna or a set of antennas.

The communications manager 615 may be an example of aspects of the communications manager 515 as described herein. The communications manager 615 may include a signal component 620, a zone identification component 625, a channel transmission part component 630, and a communicating component 635. The communications manager 615 may be an example of aspects of the communications manager 810 described herein.

The signal component 620 may receive, from a second device, a signal including one or more channel transmission parts associated with one or more zones. The zone identification component 625 may identify, based on receiving the signal, at least one zone of the one or more zones that is associated with a first device. The channel transmission part component 630 may select, based on receiving the signal and the at least one zone associated with the first device, a channel transmission part of the one or more channel transmission parts. The communicating component 635 may communicate, with the second device, based on selecting the channel transmission part.

The transmitter 640 may transmit signals generated by other components of the device 605. In some examples, the transmitter 640 may be collocated with a receiver 610 in a transceiver module. For example, the transmitter 640 may be an example of aspects of the transceiver 820 described with reference to FIG. 8. The transmitter 640 may utilize a single antenna or a set of antennas.

Figure 7:
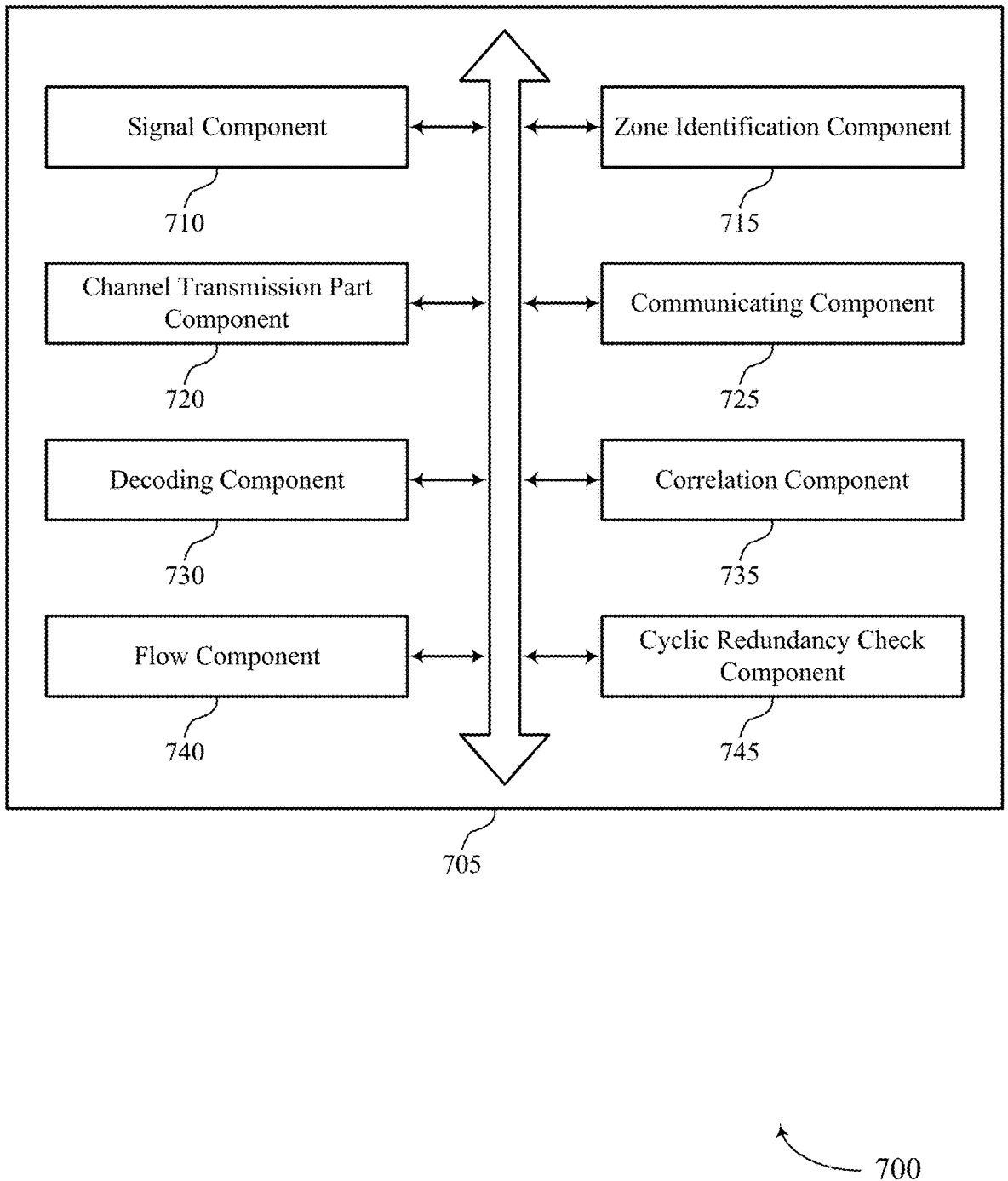
FIG. 7 shows a block diagram of a communications manager that supports zone-based signaling in NR in accordance with aspects of the present disclosure.

FIG. 7 shows a block diagram 700 of a communications manager 705 that supports zone-based signaling in NR in accordance with aspects of the present disclosure. The communications manager 705 may be an example of aspects of a communications manager 515, a communications manager 615, or a communications manager 810 described herein. The communications manager 705 may include a signal component 710, a zone identification component 715, a channel transmission part component 720, a communicating component 725, a decoding component 730, a correlation component 735, a flow component 740, and a cyclic redundancy check component 745. Each of these modules may communicate, directly or indirectly, with one another (e.g., via one or more buses).

The signal component 710 may receive, from a second device, a signal including one or more channel transmission parts associated with one or more zones. In some cases, the signal includes a broadcast signal or a multicast signal or a unicast signal. The zone identification component 715 may identify, based on receiving the signal, at least one zone of the one or more zones that is associated with the first device. The channel transmission part component 720 may select, based on receiving the signal and the at least one zone associated with the first device, a channel transmission part of the one or more channel transmission parts. The communicating component 725 may communicate, with the second device, based on selecting the channel transmission part.

The decoding component 730 may decode the channel transmission part to identify at least one code block, where communicating with the second device is based on decoding the channel transmission part. The correlation component 735 may determine a correlation between the channel transmission part and the at least one zone associated with the first device, where selecting the channel transmission part is based on the correlation.

In some examples, the channel transmission part component 720 may select a second channel transmission part based on receiving the signal and the at least one zone associated with the first device. In some examples, the channel transmission part component 720 may combine the channel transmission part and the second channel transmission part to generate a combined channel transmission part, where communicating with the second device is based on the combined channel transmission part. In some examples, the correlation component 735 may determine a correlation between the second channel transmission part and the at least one zone associated with the first device, where selecting the second channel transmission part is based on the correlation. In some examples, the channel transmission part component 720 may determine that the channel transmission part and the second channel transmission part are separately encoded, where communicating with the second device is based on the determining.

The flow component 740 may identify, based on receiving the signal, one or more flows associated with the one or more zones, where each flow of the one or more flows is associated with a respective type of information related to the one or more zones. In some examples, the flow component 740 may select, based on identifying the one or more flows and the at least one zone associated with the first device, at least one flow of the one or more flows, where selecting the channel transmission part is based on selecting the flow.

In some cases, the respective type of information related to the one or more zones includes a mapping information associated with the one or more zones, an object information associated with the one or more zones, a text information associated with a set of objects in each of the one or more zones, a graphics information associated with a set of objects in each of the one or more zones, or a combination thereof. In some cases, a quantity of flows in a first zone of the one or more zones is different than a quantity of flows in a second zone of the one or more zones. In some cases, a quantity of flows in a first zone of the one or more zones is the same as a quantity of flows in a second zone of the one or more zones. In some cases, a type of flow in a first zone of the one or more zones is different than a type of flow in a second zone of the one or more zones.

The cyclic redundancy check component 745 may determine a cyclic redundancy check value associated with one or more information bits in the channel transmission part, where communicating with the second device is based on determining the cyclic redundancy check value. In some examples, the channel transmission part component 720 may select a second channel transmission part based on receiving the signal and the at least one zone associated with the first device. In some examples, the cyclic redundancy check component 745 may determine a cyclic redundancy check value associated with a total quantity of information bits in the channel transmission part and the second channel transmission part, where communicating with the second device is based on determining the cyclic redundancy check value.

In some examples, the signal component 710 may receive, from the second device, a second signal indicating the one or more zones. In some examples, the signal component 710 may transmit, to the second device in response to receiving the second signal, a third signal indicating the at least one zone associated with the first device, where selecting the channel transmission part is based on transmitting the second signal.

In some cases, the second signal includes information related to a partitioning of the one or more zones. In some cases, the second signal is a radio resource control signal. In some cases, the signal and the second signal are separate signals. In some cases, the signal and the second signal are the same signal.

In some cases, the signal including the one or more channel transmission parts is periodic, event-triggered, or both. In some cases, a periodicity of the signal is based on a rate of change of information associated with the one or more zones, and a latency requirement associated with the first device. In some cases, the channel transmission part and a second channel transmission part of the one or more channel transmission parts are associated with the same physical downlink shared channel.

In some cases, the channel transmission part and a second channel transmission part of the one or more channel transmission parts are associated with different physical downlink shared channels. In some cases, the channel transmission part and a second channel transmission part of the one or more channel transmission parts include overlapping information. In some cases, the one or more channel transmission parts are frequency-division multiplexed, time-division multiplexed, space-division multiplexed, or a combination thereof. In some cases, the one or more channel transmission parts are interleaved or non-interleaved.

The actions performed by the communications manager 705 as described herein may be implemented to realize one or more potential advantages. For example, In some implementations, the communications manager 705 may decrease communication latency and enhance channel throughput for XR applications. The improvements in the communication link supporting XR applications (for example, decreasing communication latency and increasing data rate and reliability) may further save power and increase battery life at a UE 115 (for example, by reducing complexity and a number of retransmissions).

Figure 8:
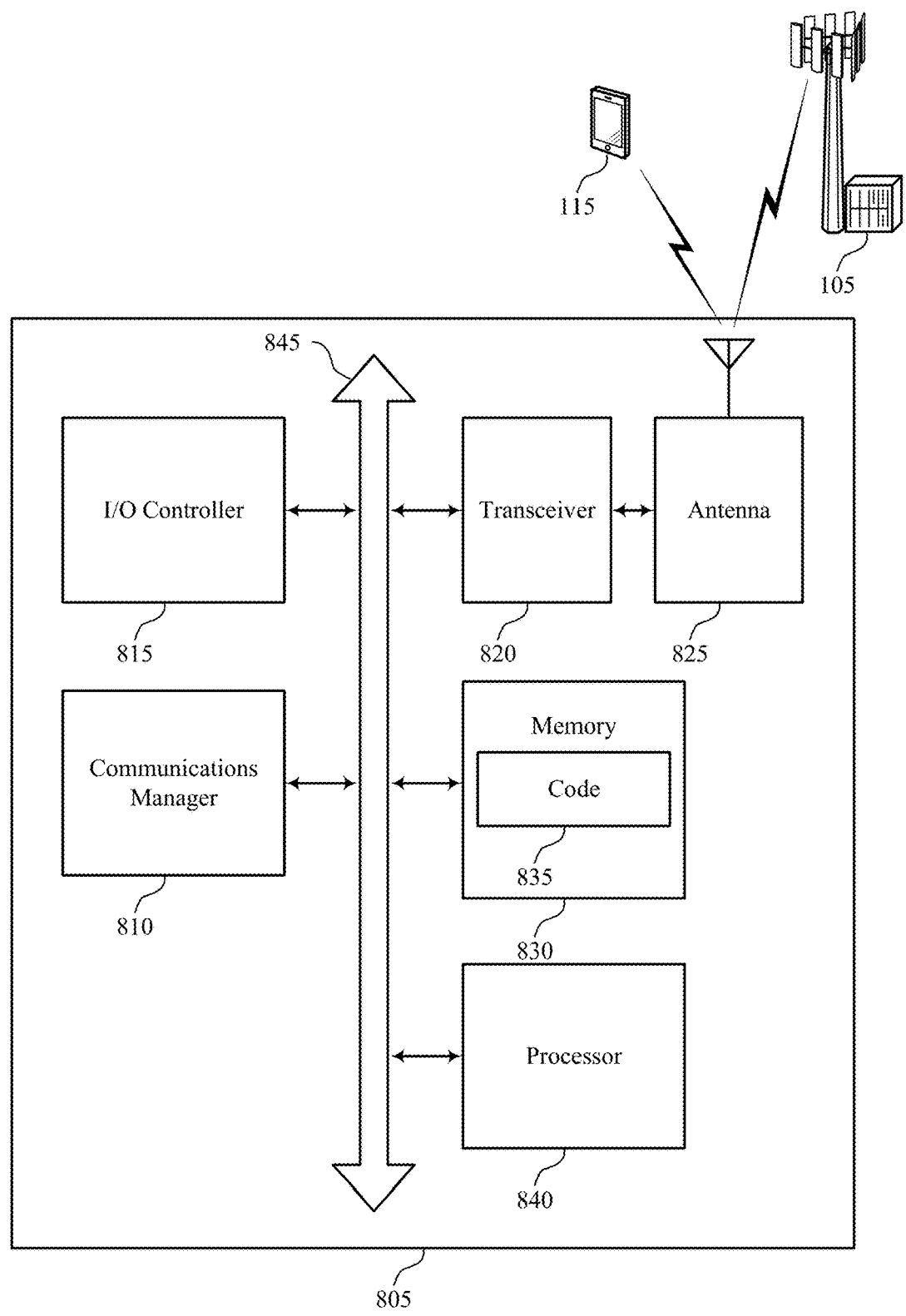
FIG. 8 shows a diagram of a system including a device that supports zone-based signaling in NR in accordance with aspects of the present disclosure.

FIG. 8 shows a diagram of a system 800 including a device 805 that supports zone-based signaling in NR in accordance with aspects of the present disclosure. The device 805 may be an example of or include the components of device 505, device 605, or a UE 115 as described herein. The device 805 may include components for bi-directional voice and data communications including components for transmitting and receiving communications, including a communications manager 810, an I/O controller 815, a transceiver 820, an antenna 825, memory 830, and a processor 840. These components may be in electronic communication via one or more buses (e.g., bus 845).

The communications manager 810 may receive, from a second device, a signal including one or more channel transmission parts associated with one or more zones. The communications manager 810 may identify, based on receiving the signal, at least one zone of the one or more zones that is associated with a first device. The communications manager 810 may select, based on receiving the signal and the at least one zone associated with the first device, a channel transmission part of the one or more channel transmission parts. The communications manager 810 may communicate, with the second device, based on selecting the channel transmission part.

The I/O controller 815 may manage input and output signals for the device 805. The I/O controller 815 may also manage peripherals not integrated into the device 805. In some cases, the I/O controller 815 may represent a physical connection or port to an external peripheral. In some cases, the I/O controller 815 may utilize an operating system such as iOS®, ANDROID®, MS-DOS®, MS-WINDOWS®, OS/2®, UNIX®, LINUX®, or another known operating system. In other cases, the I/O controller 815 may represent or interact with a modem, a keyboard, a mouse, a touch-screen, or a similar device. In some cases, the I/O controller 815 may be implemented as part of a processor. In some cases, a user may interact with the device 805 via the I/O controller 815 or via hardware components controlled by the I/O controller 815.

The transceiver 820 may communicate bi-directionally, via one or more antennas, wired, or wireless links as described herein. For example, the transceiver 820 may represent a wireless transceiver and may communicate bi-directionally with another wireless transceiver. The transceiver 820 may also include a modem to modulate the packets and provide the modulated packets to the antennas for transmission, and to demodulate packets received from the antennas. In some cases, the wireless device may include a single antenna 825. However, in some cases the device may have more than one antenna 825, which may be capable of concurrently transmitting or receiving multiple wireless transmissions.

The memory 830 may include random-access memory (RAM) and read-only memory (ROM). The memory 830 may store computer-readable, computer-executable code 835 including instructions that, when executed, cause the processor to perform various functions described herein. In some cases, the memory 830 may contain, among other things, a basic I/O system (BIOS) which may control basic hardware or software operation such as the interaction with peripheral components or devices.

The processor 840 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 840 may be configured to operate a memory array using a memory controller. In other cases, a memory controller may be integrated into the processor 840. The processor 840 may be configured to execute computer-readable instructions stored in a memory (e.g., the memory 830) to cause the device 805 to perform various functions (e.g., functions or tasks supporting zone-based signaling in NR).

The code 835 may include instructions to implement aspects of the present disclosure, including instructions to support wireless communications. The code 835 may be stored in a non-transitory computer-readable medium such as system memory or other type of memory. In some cases, the code 835 may not be directly executable by the processor 840 but may cause a computer (e.g., when compiled and executed) to perform functions described herein.

Figure 9:
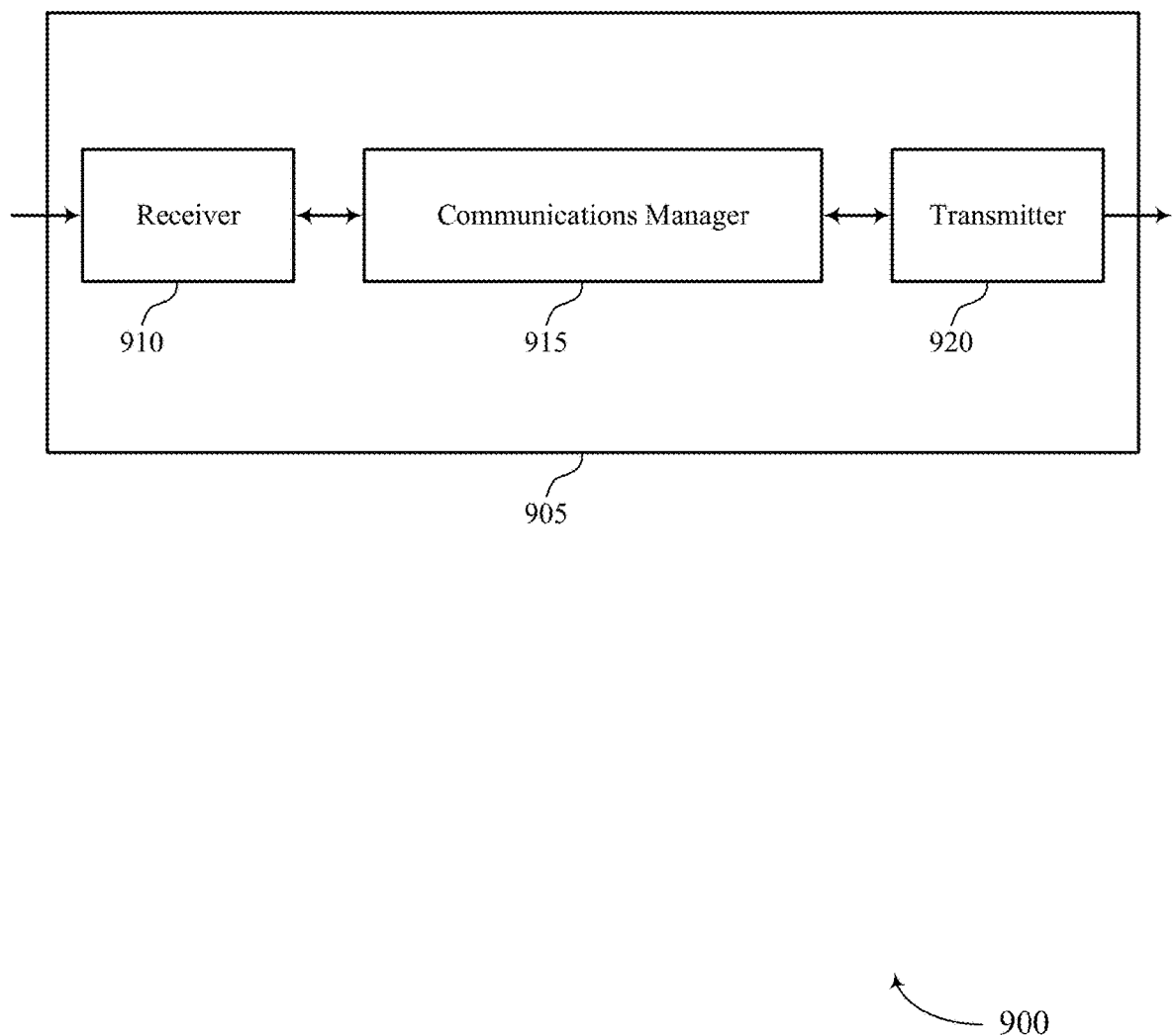
FIGS. 9 and 10 show block diagrams of devices that support zone-based signaling in NR in accordance with aspects of the present disclosure.

FIG. 9 shows a block diagram 900 of a device 905 that supports zone-based signaling in NR in accordance with aspects of the present disclosure. The device 905 may be an example of aspects of a base station 105 as described herein. The device 905 may include a receiver 910, a communications manager 915, and a transmitter 920. The device 905 may also include a processor. Each of these components may be in communication with one another (e.g., via one or more buses).

The receiver 910 may receive information such as packets, user data, or control information associated with various information channels (e.g., control channels, data channels, and information related to zone-based signaling in NR, etc.). Information may be passed on to other components of the device 905. The receiver 910 may be an example of aspects of the transceiver 1220 described with reference to FIG. 12. The receiver 910 may utilize a single antenna or a set of antennas.

The communications manager 915 may transmit, to a set of devices, a signal including one or more channel transmission parts associated with one or more zones. The communications manager 915 may identify, based on transmitting the signal, at least one zone of the one or more zones that is associated with a first device of the set of devices. The communications manager 915 may communicate, with the first device, based on a channel transmission part of the one or more channel transmission parts. The communications manager 915 may be an example of aspects of the communications manager 1210 described herein.

The communications manager 915, or its sub-components, may be implemented in hardware, code (e.g., software or firmware) executed by a processor, or any combination thereof. If implemented in code executed by a processor, the functions of the communications manager 915, or its sub-components may be executed by a general-purpose processor, a DSP, an ASIC, a FPGA or other programmable logic device, discrete gate or transistor logic, discrete hardware components, or any combination thereof designed to perform the functions described in the present disclosure.

The communications manager 915, or its sub-components, may be physically located at various positions, including being distributed such that portions of functions are implemented at different physical locations by one or more physical components. In some examples, the communications manager 915, or its sub-components, may be a separate and distinct component in accordance with various aspects of the present disclosure. In some examples, the communications manager 915, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 920 may transmit signals generated by other components of the device 905. In some examples, the transmitter 920 may be collocated with a receiver 910 in a transceiver module. For example, the transmitter 920 may be an example of aspects of the transceiver 1220 described with reference to FIG. 12. The transmitter 920 may utilize a single antenna or a set of antennas.

Figure 10:
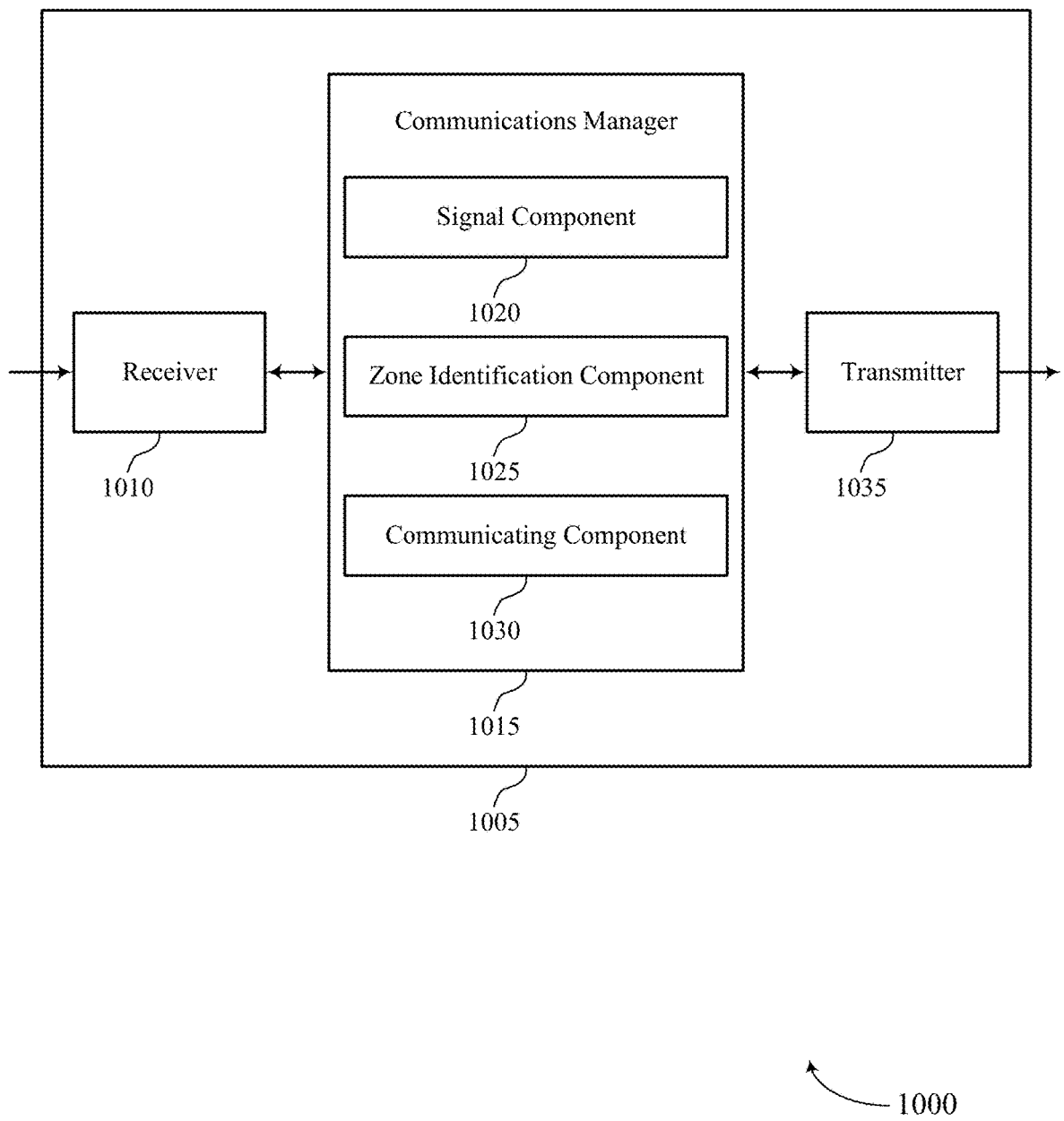

FIG. 10 shows a block diagram 1000 of a device 1005 that supports zone-based signaling in NR in accordance with aspects of the present disclosure. The device 1005 may be an example of aspects of a device 905, or a base station 105 as described herein. The device 1005 may include a receiver 1010, a communications manager 1015, and a transmitter 1035. The device 1005 may also include a processor. Each of these components may be in communication with one another (e.g., via one or more buses).

The receiver 1010 may receive information such as packets, user data, or control information associated with various information channels (e.g., control channels, data channels, and information related to zone-based signaling in NR, etc.). Information may be passed on to other components of the device 1005. The receiver 1010 may be an example of aspects of the transceiver 1220 described with reference to FIG. 12. The receiver 1010 may utilize a single antenna or a set of antennas.

The communications manager 1015 may be an example of aspects of the communications manager 915 as described herein. The communications manager 1015 may include a signal component 1020, a zone identification component 1025, and a communicating component 1030. The communications manager 1015 may be an example of aspects of the communications manager 1210 described herein.

The signal component 1020 may transmit, to a set of devices, a signal including one or more channel transmission parts associated with one or more zones. The zone identification component 1025 may identify, based on transmitting the signal, at least one zone of the one or more zones that is associated with a first device of the set of devices. The communicating component 1030 may communicate, with the first device, based on a channel transmission part of the one or more channel transmission parts.

The transmitter 1035 may transmit signals generated by other components of the device 1005. In some examples, the transmitter 1035 may be collocated with a receiver 1010 in a transceiver module. For example, the transmitter 1035 may be an example of aspects of the transceiver 1220 described with reference to FIG. 12. The transmitter 1035 may utilize a single antenna or a set of antennas.

Figure 11:
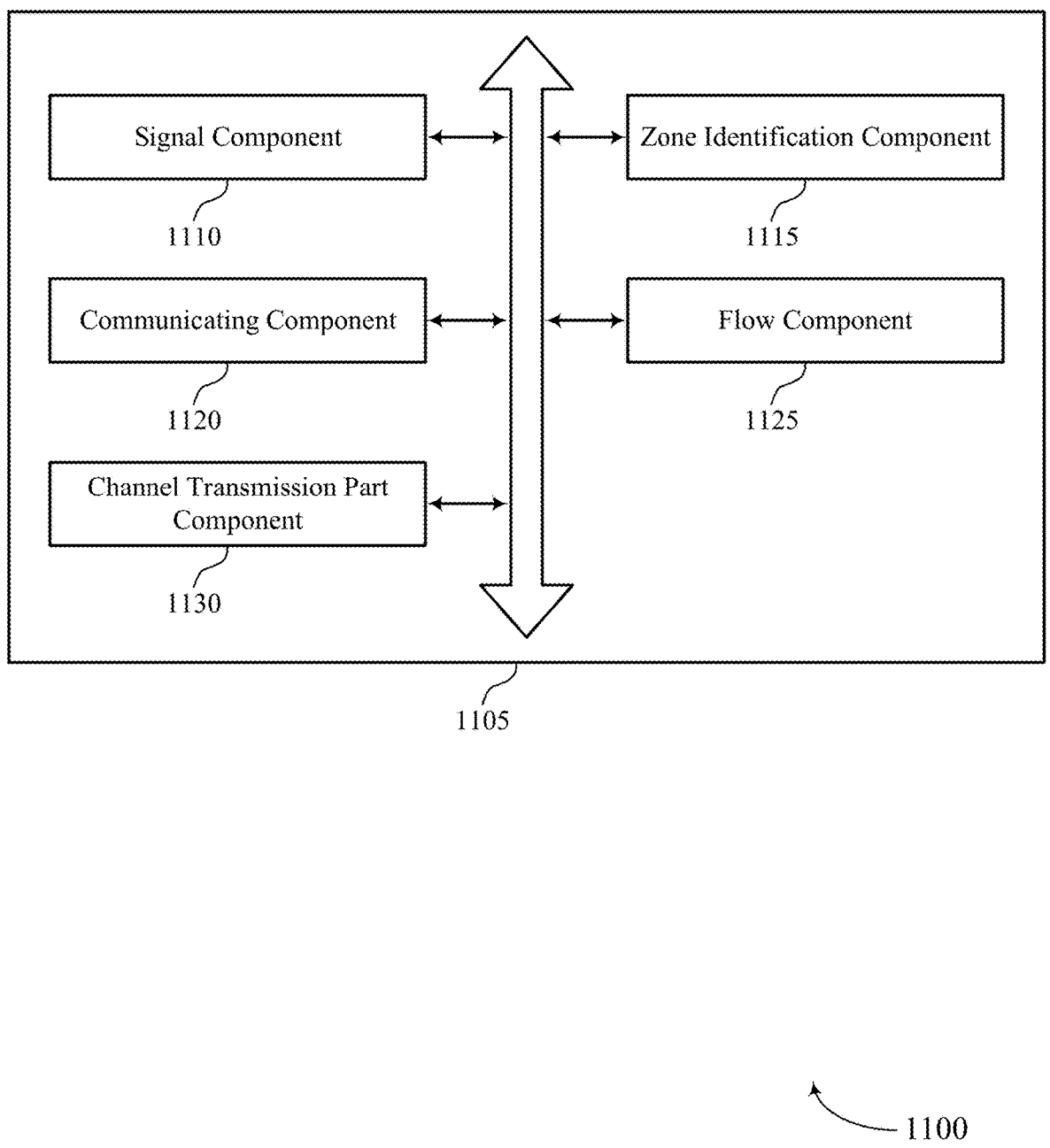
FIG. 11 shows a block diagram of a communications manager that supports zone-based signaling in NR in accordance with aspects of the present disclosure.

FIG. 11 shows a block diagram 1100 of a communications manager 1105 that supports zone-based signaling in NR in accordance with aspects of the present disclosure. The communications manager 1105 may be an example of aspects of a communications manager 915, a communications manager 1015, or a communications manager 1210 described herein. The communications manager 1105 may include a signal component 1110, a zone identification component 1115, a communicating component 1120, a flow component 1125, and a channel transmission part component 1130. Each of these modules may communicate, directly or indirectly, with one another (e.g., via one or more buses).

The signal component 1110 may transmit, to a set of devices, a signal including one or more channel transmission parts associated with one or more zones. The zone identification component 1115 may identify, based on transmitting the signal, at least one zone of the one or more zones that is associated with a first device of the set of devices. The communicating component 1120 may communicate, with the first device, based on a channel transmission part of the one or more channel transmission parts.

The flow component 1125 may determine one or more flows associated with the one or more zones, where each flow of the one or more flows is associated with a respective type of information related to the one or more zones, and where transmitting the signal further includes transmitting the one or more flows. In some cases, the respective type of information related to the one or more zones includes a mapping information associated with the one or more zones, an object information associated with the one or more zones, a text information associated with a set of objects in each of the one or more zones, a graphics information associated with a set of objects in each of the one or more zones, or a combination thereof.

In some cases, a quantity of flows in a first zone of the one or more zones is different than a quantity of flows in a second zone of the one or more zones. In some cases, a quantity of flows in a first zone of the one or more zones is the same as a quantity of flows in a second zone of the one or more zones. In some cases, a type of flow in a first zone of the one or more zones is different than a type of flow in a second zone of the one or more zones.

In some examples, the signal component 1110 may transmit, to the first device, a second signal indicating the one or more zones. In some examples, the signal component 1110 may receive, from the first device in response to transmitting the second signal, a third signal indicating the at least one zone associated with the first device.

In some cases, the second signal includes information related to a partitioning of the one or more zones. In some cases, the second signal is a radio resource control signal. In some cases, the signal and the second signal are separate signals. In some cases, the signal and the second signal are the same signal. In some cases, the signal including the one or more channel transmission parts is periodic, or event-triggered, or both. In some cases, a periodicity of the signal is based on a rate of change of information associated with the one or more zones, and a latency requirement associated with the first device. In some cases, the signal includes a broadcast signal or a multicast signal or a unicast signal.

The channel transmission part component 1130 may identify one or more characteristics associated with the channel transmission parts. In some cases, the channel transmission part and a second channel transmission part of the one or more channel transmission parts are associated with the same physical downlink shared channel. In some cases, the channel transmission part and a second channel transmission part of the one or more channel transmission parts are associated with different physical downlink shared channels.

In some cases, the channel transmission part and a second channel transmission part of the one or more channel transmission parts include overlapping information. In some cases, the one or more channel transmission parts are frequency-division multiplexed, time-division multiplexed, space-division multiplexed, or a combination thereof. In some cases, the one or more channel transmission parts are interleaved or non-interleaved.

Figure 12:
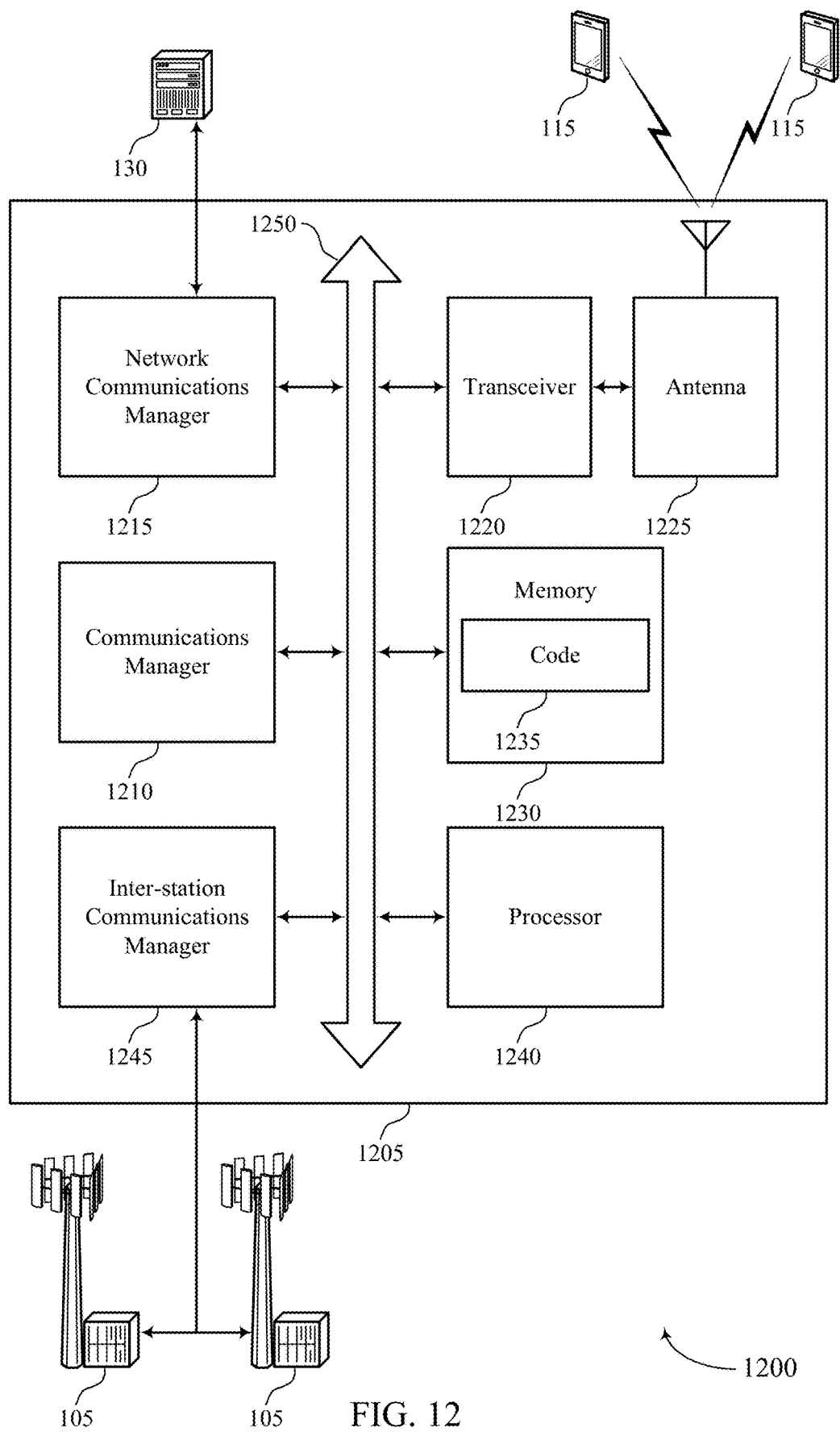
FIG. 12 shows a diagram of a system including a device that supports zone-based signaling in NR in accordance with aspects of the present disclosure.

FIG. 12 shows a diagram of a system 1200 including a device 1205 that supports zone-based signaling in NR in accordance with aspects of the present disclosure. The device 1205 may be an example of or include the components of device 905, device 1005, or a base station 105 as described herein. The device 1205 may include components for bi-directional voice and data communications including components for transmitting and receiving communications, including a communications manager 1210, a network communications manager 1215, a transceiver 1220, an antenna 1225, memory 1230, a processor 1240, and an inter-station communications manager 1245. These components may be in electronic communication via one or more buses (e.g., bus 1250).

The communications manager 1210 may transmit, to a set of devices, a signal including one or more channel transmission parts associated with one or more zones. The communications manager 1210 may identify, based on transmitting the signal, at least one zone of the one or more zones that is associated with a first device of the set of devices. The communications manager 1210 may communicate, with the first device, based on a channel transmission part of the one or more channel transmission parts.

The network communications manager 1215 may manage communications with the core network (e.g., via one or more wired backhaul links). For example, the network communications manager 1215 may manage the transfer of data communications for client devices, such as one or more UEs 115.

The transceiver 1220 may communicate bi-directionally, via one or more antennas, wired, or wireless links as described herein. For example, the transceiver 1220 may represent a wireless transceiver and may communicate bi-directionally with another wireless transceiver. The transceiver 1220 may also include a modem to modulate the packets and provide the modulated packets to the antennas for transmission, and to demodulate packets received from the antennas. In some cases, the wireless device may include a single antenna 1225. However, in some cases the device may have more than one antenna 1225, which may be capable of concurrently transmitting or receiving multiple wireless transmissions.

The memory 1230 may include RAM, ROM, or a combination thereof. The memory 1230 may store computer-readable code 1235 including instructions that, when executed by a processor (e.g., the processor 1240) cause the device to perform various functions described herein. In some cases, the memory 1230 may contain, among other things, a BIOS which may control basic hardware or software operation such as the interaction with peripheral components or devices.

The processor 1240 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1240 may be configured to operate a memory array using a memory controller. In some cases, a memory controller may be integrated into processor 1240. The processor 1240 may be configured to execute computer-readable instructions stored in a memory (e.g., the memory 1230) to cause the device 1205 to perform various functions (e.g., functions or tasks supporting zone-based signaling in NR).

The inter-station communications manager 1245 may manage communications with other base station 105, and may include a controller or scheduler for controlling communications with UEs 115 in cooperation with other base stations 105. For example, the inter-station communications manager 1245 may coordinate scheduling for transmissions to UEs 115 for various interference mitigation techniques such as beamforming or joint transmission. In some examples, the inter-station communications manager 1245 may provide an X2 interface within an LTE/LTE-A wireless communication network technology to provide communication between base stations 105.

The code 1235 may include instructions to implement aspects of the present disclosure, including instructions to support wireless communications. The code 1235 may be stored in a non-transitory computer-readable medium such as system memory or other type of memory. In some cases, the code 1235 may not be directly executable by the processor 1240 but may cause a computer (e.g., when compiled and executed) to perform functions described herein.

Figure 13:
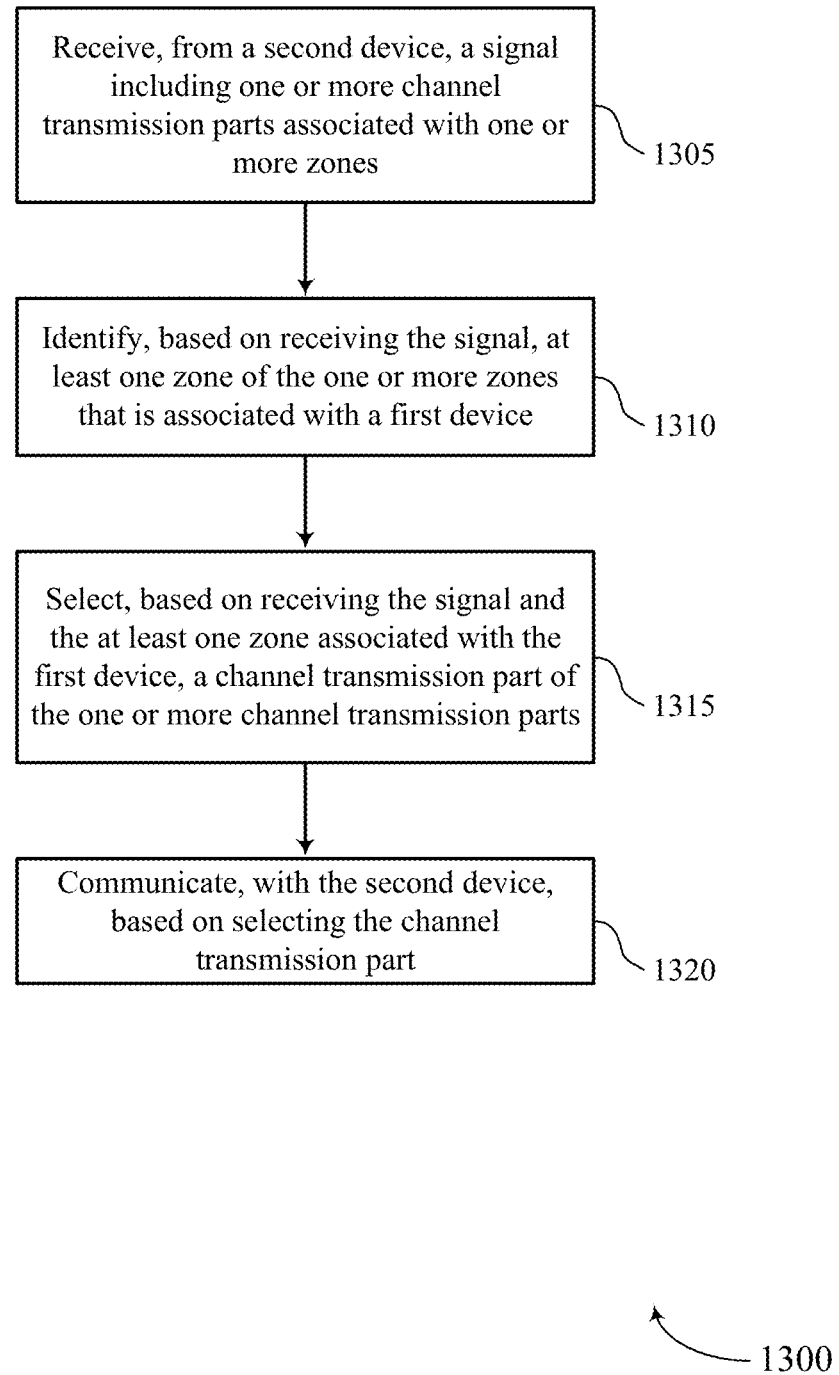
FIGS. 13 through 15 show flowcharts illustrating methods that support zone-based signaling in NR in accordance with aspects of the present disclosure.

FIG. 13 shows a flowchart illustrating a method 1300 that supports zone-based signaling in NR in accordance with aspects of the present disclosure. The operations of method 1300 may be implemented by a UE 115 or its components as described herein. For example, the operations of method 1300 may be performed by a communications manager as described with reference to FIGS. 5 through 8. In some examples, a first device may execute a set of instructions to control the functional elements of the first device to perform the functions described herein. Additionally or alternatively, a first device may perform aspects of the functions described herein using special-purpose hardware.

At 1305, the first device may receive, from a second device, a signal including one or more channel transmission parts associated with one or more zones. The operations of 1305 may be performed according to the methods described herein. In some examples, aspects of the operations of 1305 may be performed by a signal component as described with reference to FIGS. 5 through 8.

At 1310, the first device may identify, based on receiving the signal, at least one zone of the one or more zones that is associated with the first device. The operations of 1310 may be performed according to the methods described herein. In some examples, aspects of the operations of 1310 may be performed by a zone identification component as described with reference to FIGS. 5 through 8.

At 1315, the first device may select, based on receiving the signal and the at least one zone associated with the first device, a channel transmission part of the one or more channel transmission parts. The operations of 1315 may be performed according to the methods described herein. In some examples, aspects of the operations of 1315 may be performed by a channel transmission part component as described with reference to FIGS. 5 through 8.

At 1320, the first device may communicate, with the second device, based on selecting the channel transmission part. The operations of 1320 may be performed according to the methods described herein. In some examples, aspects of the operations of 1320 may be performed by a communicating component as described with reference to FIGS. 5 through 8.

Figure 14:
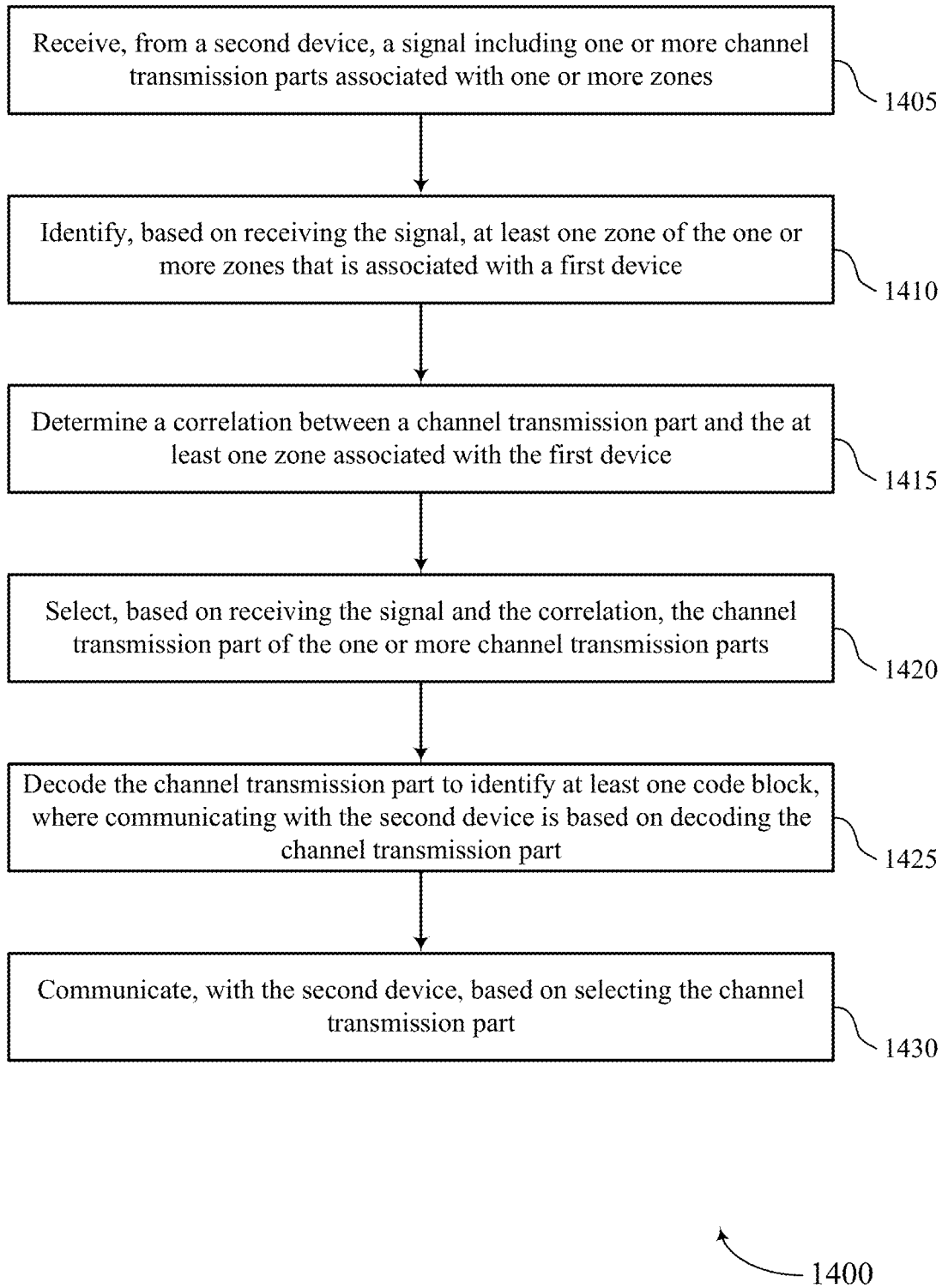

FIG. 14 shows a flowchart illustrating a method 1400 that supports zone-based signaling in NR in accordance with aspects of the present disclosure. The operations of method 1400 may be implemented by a UE 115 or its components as described herein. For example, the operations of method 1400 may be performed by a communications manager as described with reference to FIGS. 5 through 8. In some examples, a first device may execute a set of instructions to control the functional elements of the first device to perform the functions described herein. Additionally or alternatively, a first device may perform aspects of the functions described herein using special-purpose hardware.

At 1405, the first device may receive, from a second device, a signal including one or more channel transmission parts associated with one or more zones. The operations of 1405 may be performed according to the methods described herein. In some examples, aspects of the operations of 1405 may be performed by a signal component as described with reference to FIGS. 5 through 8.

At 1410, the first device may identify, based on receiving the signal, at least one zone of the one or more zones that is associated with the first device. The operations of 1410 may be performed according to the methods described herein. In some examples, aspects of the operations of 1410 may be performed by a zone identification component as described with reference to FIGS. 5 through 8.

At 1415, the first device may determine a correlation between a channel transmission part and the at least one zone associated with the first device. The operations of 1415 may be performed according to the methods described herein. In some examples, aspects of the operations of 1415 may be performed by a correlation component as described with reference to FIGS. 5 through 8.

At 1420, the first device may select, based on receiving the signal and the correlation, the channel transmission part of the one or more channel transmission parts. The operations of 1420 may be performed according to the methods described herein. In some examples, aspects of the operations of 1420 may be performed by a channel transmission part component as described with reference to FIGS. 5 through 8.

At 1425, the first device may decode the channel transmission part to identify at least one code block, where communicating with the second device is based on decoding the channel transmission part. The operations of 1425 may be performed according to the methods described herein. In some examples, aspects of the operations of 1425 may be performed by a decoding component as described with reference to FIGS. 5 through 8.

At 1430, the first device may communicate, with the second device, based on selecting the channel transmission part. The operations of 1430 may be performed according to the methods described herein. In some examples, aspects of the operations of 1430 may be performed by a communicating component as described with reference to FIGS. 5 through 8.

Figure 15:
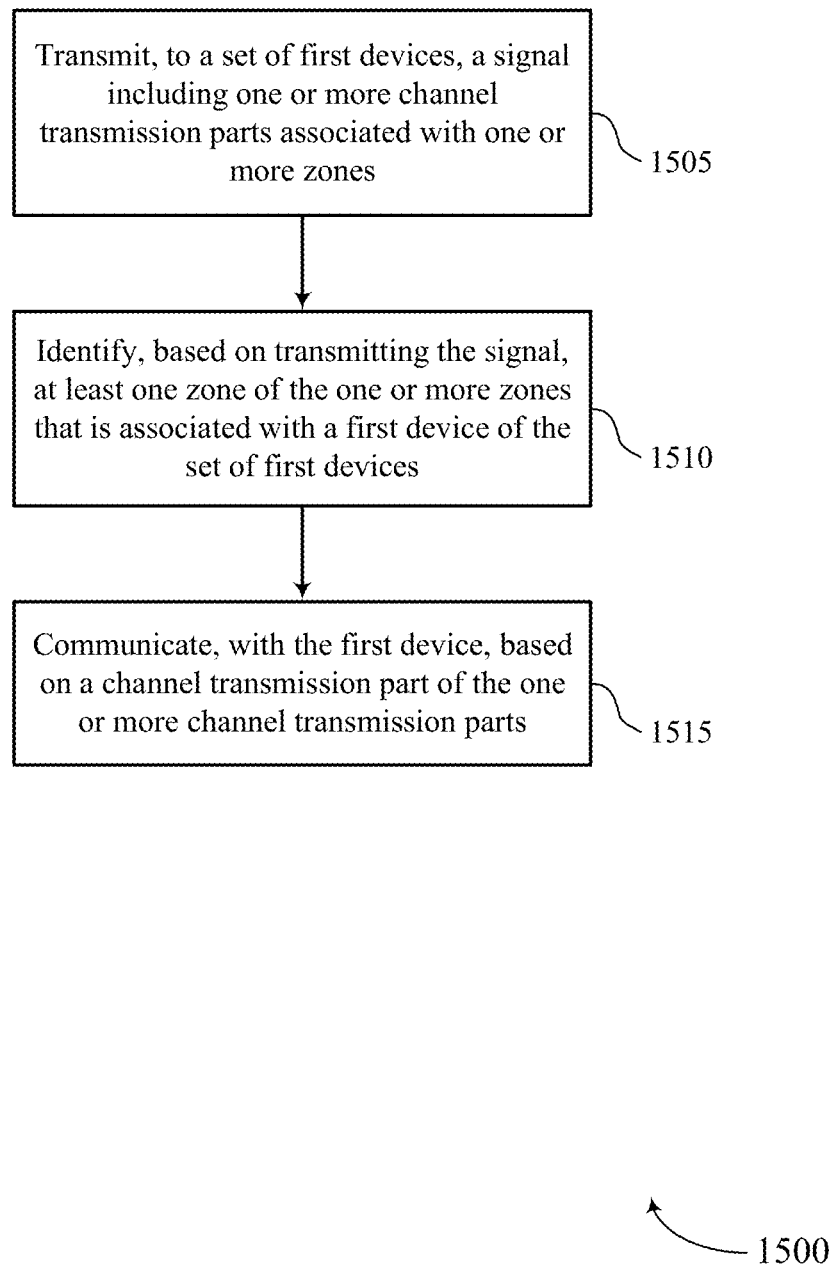

FIG. 15 shows a flowchart illustrating a method 1500 that supports zone-based signaling in NR in accordance with aspects of the present disclosure. The operations of method 1500 may be implemented by a base station 105 or its components as described herein or by a UE 115 or its components as described herein. For example, the operations of method 1500 may be performed by a communications manager as described with reference to FIGS. 9 through 12 or FIGS. 5 through 8. In some examples, a second device may execute a set of instructions to control the functional elements of the second device to perform the functions described herein. Additionally or alternatively, a second device may perform aspects of the functions described herein using special-purpose hardware.

At 1505, the second device may transmit, to a set of first devices, a signal including one or more channel transmission parts associated with one or more zones. The operations of 1505 may be performed according to the methods described herein. In some examples, aspects of the operations of 1505 may be performed by a signal component as described with reference to FIGS. 9 through 12.

At 1510, the second device may identify, based on transmitting the signal, at least one zone of the one or more zones that is associated with a first device of the set of first devices. The operations of 1510 may be performed according to the methods described herein. In some examples, aspects of the operations of 1510 may be performed by a zone identification component as described with reference to FIGS. 9 through 12.

At 1515, the second device may communicate, with the first device, based on a channel transmission part of the one or more channel transmission parts. The operations of 1515 may be performed according to the methods described herein. In some examples, aspects of the operations of 1515 may be performed by a communicating component as described with reference to FIGS. 9 through 12.

It should be noted that the methods described herein describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs with service subscriptions with the network provider. A small cell may be associated with a lower-powered base station, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication at a first device, comprising:
receiving, from a second device, a signal comprising one or more channel transmission parts corresponding to one or more zones;
identifying, based at least in part on receiving the signal, at least one zone of the one or more zones that is associated with the first device;
selecting, based at least in part on receiving the signal and the at least one zone associated with the first device, a channel transmission part of the one or more channel transmission parts; and
communicating, with the second device, based at least in part on selecting the channel transmission part.

2. The method of claim 1, further comprising:
decoding the channel transmission part to identify at least one code block, wherein communicating with the second device is based at least in part on decoding the channel transmission part.

3. The method of claim 1, further comprising:
determining a correlation between the channel transmission part and the at least one zone associated with the first device, wherein selecting the channel transmission part is based at least in part on the correlation.

4. The method of claim 1, further comprising:
selecting a second channel transmission part based at least in part on receiving the signal and the at least one zone associated with the first device; and
combining the channel transmission part and the second channel transmission part to generate a combined channel transmission part, wherein communicating with the second device is based at least in part on the combined channel transmission part.

5. The method of claim 4, further comprising:
determining a correlation between the second channel transmission part and the at least one zone associated with the first device, wherein selecting the second channel transmission part is based at least in part on the correlation.

6. The method of claim 4, further comprising:
determining that the channel transmission part and the second channel transmission part are separately encoded, wherein communicating with the second device is based at least in part on the determining.

7. The method of claim 1, further comprising:
identifying, based at least in part on receiving the signal, one or more flows associated with the one or more zones, wherein each flow of the one or more flows is associated with a respective type of information related to the one or more zones; and
selecting, based at least in part on identifying the one or more flows and the at least one zone associated with the first device, at least one flow of the one or more flows, wherein selecting the channel transmission part is based at least in part on selecting the flow.

8. The method of claim 7, wherein the respective type of information related to the one or more zones comprises a mapping information associated with the one or more zones, an object information associated with the one or more zones, a text information associated with a plurality of objects in each of the one or more zones, a graphics information associated with a plurality of objects in each of the one or more zones, or a combination thereof.

9. The method of claim 7, wherein a quantity of flows in a first zone of the one or more zones is different than a quantity of flows in a second zone of the one or more zones.

10. The method of claim 7, wherein a quantity of flows in a first zone of the one or more zones is the same as a quantity of flows in a second zone of the one or more zones.

11. The method of claim 7, wherein a type of flow in a first zone of the one or more zones is different than a type of flow in a second zone of the one or more zones.

12. The method of claim 1, further comprising:
determining a cyclic redundancy check value associated with one or more information bits in the channel transmission part, wherein communicating with the second device is based at least in part on determining the cyclic redundancy check value.

13. The method of claim 1, further comprising:
selecting a second channel transmission part based at least in part on receiving the signal and the at least one zone associated with the first device; and
determining a cyclic redundancy check value associated with a total quantity of information bits in the channel transmission part and the second channel transmission part, wherein communicating with the second device is based at least in part on determining the cyclic redundancy check value.

14. The method of claim 1, further comprising:
receiving, from the second device, a second signal indicating the one or more zones; and
transmitting, to the second device in response to receiving the second signal, a third signal indicating the at least one zone associated with the first device, wherein selecting the channel transmission part is based at least in part on transmitting the second signal.

15. The method of claim 14, wherein the second signal comprises information related to a partitioning of the one or more zones.

16. The method of claim 14, wherein the second signal is a radio resource control signal.

17. The method of claim 14, wherein the signal and the second signal are separate signals.

18. The method claim 14, wherein the signal and the second signal are the same signal.

19. The method of claim 1, wherein the channel transmission part and a second channel transmission part of the one or more channel transmission parts are associated with the same physical downlink shared channel.

20. The method of claim 1, wherein the channel transmission part and a second channel transmission part of the one or more channel transmission parts are associated with different physical downlink shared channels.

21. The method of claim 1, wherein the channel transmission part and a second channel transmission part of the one or more channel transmission parts include overlapping information.

22. The method of claim 1, wherein the signal comprising the one or more channel transmission parts is periodic, event-triggered, or both.

23. The method of claim 22, wherein a periodicity of the signal is based at least in part on a rate of change of information associated with the one or more zones, and a latency requirement associated with the first device.

24. The method of claim 1, wherein the signal comprises broadcast signal or a multicast signal or a unicast signal.

25. The method of claim 1, wherein the one or more channel transmission parts are frequency-division multiplexed, time-division multiplexed, space-division multiplexed, or a combination thereof.

26. An apparatus for wireless communication at a first device, comprising:
a processor,
memory coupled with the processor; and
instructions stored in the memory and executable by the processor to cause the apparatus to:
receive, from a second device, a signal comprising one or more channel transmission parts corresponding to one or more zones;
identify, based at least in part on receiving the signal, at least one zone of the one or more zones that is associated with the first device;
select, based at least in part on receiving the signal and the at least one zone associated with the first device, a channel transmission part of the one or more channel transmission parts; and communicate, with the second device, based at least in part on selecting the channel transmission part.

27. The apparatus of claim 26, wherein the instructions are further executable by the processor to cause the apparatus to:
   decode the channel transmission part to identify at least one code block, wherein communicating with the second device is based at least in part on decoding the channel transmission part.

28. The apparatus of claim 26, wherein the instructions are further executable by the processor to cause the apparatus to:
   determine a correlation between the channel transmission part and the at least one zone associated with the first device, wherein selecting the channel transmission part is based at least in part on the correlation.

29. An apparatus for wireless communication at a first device, comprising:
   means for receiving, from a second device, a signal comprising one or more channel transmission parts corresponding to one or more zones;
   means for identifying, based at least in part on receiving the signal, at least one zone of the one or more zones that is associated with the first device;
   means for selecting, based at least in part on receiving the signal and the at least one zone associated with the first device, a channel transmission part of the one or more channel transmission parts; and
   means for communicating, with the second device, based at least in part on selecting the channel transmission part.

30. A non-transitory computer-readable medium storing code for wireless communication at a first device, the code comprising instructions executable by a processor to:
   receive, from a second device, a signal comprising one or more channel transmission parts corresponding to one or more zones;
   identify, based at least in part on receiving the signal, at least one zone of the one or more zones that is associated with the first device;
   select, based at least in part on receiving the signal and the at least one zone associated with the first device, a channel transmission part of the one or more channel transmission parts; and
   communicate, with the second device, based at least in part on selecting the channel transmission part.

\* \* \* \* \*